United States Patent [19]
Deferm

[11] Patent Number: 6,071,825
[45] Date of Patent: Jun. 6, 2000

[54] FULLY OVERLAPPED NITRIDE-ETCH DEFINED DEVICE AND PROCESSING SEQUENCE

[75] Inventor: Ludo Deferm, Beverlo, Belgium

[73] Assignee: InterUniversitaire Microelektronica Centrum (IMEC VZW), Leuven, Belgium

[21] Appl. No.: 08/984,778

[22] Filed: Dec. 4, 1997

Related U.S. Application Data

[62] Division of application No. 08/680,713, Jul. 11, 1996, abandoned
[60] Provisional application No. 60/008,377, Dec. 8, 1995, and provisional application No. 60/001,230, Jul. 19, 1995.

[51] Int. Cl.[7] .................................................. H01L 21/00
[52] U.S. Cl. ............................................. 438/719; 438/735
[58] Field of Search .................................... 438/719, 735, 438/738; 216/79, 99

[56] References Cited

U.S. PATENT DOCUMENTS

| | | | |
|---|---|---|---|
| 4,447,290 | 5/1984 | Matthews | 438/719 |
| 4,949,136 | 8/1990 | Jain | 257/344 |
| 5,061,975 | 10/1991 | Inuishi et al. | 257/344 |
| 5,089,865 | 2/1992 | Mitsui et al. | 257/384 |
| 5,146,309 | 9/1992 | Spinner et al. | 257/336 |
| 5,341,028 | 8/1994 | Yamaguchi et al. | 257/344 |
| 5,479,367 | 12/1995 | Maurelli et al. | 257/408 |
| 5,536,957 | 7/1996 | Okumura | 257/336 |
| 5,554,871 | 9/1996 | Yamashita et al. | 257/336 |
| 5,567,956 | 10/1996 | Kim | 257/408 |
| 5,620,919 | 4/1997 | Godinho et al. | 438/230 |
| 5,625,217 | 4/1997 | Chau et al. | 257/408 |
| 5,635,746 | 6/1997 | Kimura et al. | 257/382 |
| 5,640,035 | 6/1997 | Sudo et al. | 257/336 |

OTHER PUBLICATIONS

"A New Procedure for Lifetime Prediction of N–Channel Mos–Transistors Using the Charge Pumping Technique", Bellens, et al., *IEEE/IRPS*, pp. 8–14, 1988.

"Gate–Capacitance Characteristics of Deep Submicron LATID (Large–Angle–Tilt Implanted Drain) MOSFET's", Hori, et al., *IEDM Techn. Dig.*, pp. 375–378, 1991.

"Gate Capacitance Characteristics of Gate/N–Overlap LDD Transistor with High Performance and High Reliability", Inuishi, et al., *IEDM Techn. Dig.*, pp. 371–374, 1991.

"A Model Study of the Hot–Carrier Problem in LDD and Overlapped LDD MOSFETs", Habas, et al., *Microelectronics Engineering*, pp. 285–288, 1995.

"FOND (Fully Overlapped Nitride–Etch Defined Device): a new device architecture for high–reliability and high–performance deep submicron CMOS technology", Mieville, et al., *IEDM Techn. Dig.*, pp. 83–86,1994.

"A Novel Subirmcon LDD Transistor with Inverse–T Gate Structure", Huang, et al., *IEDM Techn. Dig.*, pp. 742–745, 1986.

"Deep–Submicrometer Large–Angle–Tilt Implanted Drain (LATID) Technology", Hori, et al., *IEEE Trans. on Electr. Dev.*, vol. ED–39, pp. 2312–2324, 1992.

"Impact of the Gate–Drain Overlapped Device (GOLD) for Deep Submicrometer VLSI", Izawa, et al., *IEEE Trans. on Electr. Dev.*, vol. ED–35, pp. 2088–2093, 1988.

"Characterization of the Overlap Capacitance of Submicron LDD MOSFETs", Kol'dyaev, et al., *Proc. ESSDERC*, pp. 757–760, 1995.

"Gate–Capacitance Characteristics of Deep–Submicron LATID (Large–Angle–Tilt Implanted Drain) MOSFETs", Hori, et al., *IEEE*, pp. 13.6.1–13.6.4, 1991.

*Primary Examiner*—William Powell
*Attorney, Agent, or Firm*—Knobbe, Martens, Olson & Bear LLP

[57] ABSTRACT

The present invention relates to methods for fabricating Fully Overlapped Nitride-Etch Defined (Fond) devices. These methods permit the lateral dimension and depth of the lowly-doped source and drain extensions to be independently controlled and well defined.

14 Claims, 19 Drawing Sheets

FULLY OVERLAPPED NITRIDE-ETCH DEFINED DEVICE AND PROCESSING SEQUENCE

RELATED APPLICATIONS

This application is a divisional of application Ser. No. 08/680,713, filed Jul. 11, 1996, now abandoned, which claims priority from Provisional Patent Application Ser. No. 60/008,377 filed Dec. 8, 1995 and Provisional Patent Application Ser. No. 60/001,230 filed Jul. 19, 1995.

BACKGROUND OF THE INVENTION

1. Field of the Invention

The present invention relates to semiconductor processing and, more particularly, to CMOS processes including Lowly Doped Drain (LDD) region transistors.

2. Description of the Related Technology

With the continuous downscaling of MOSFET devices (Metal-Oxide-Semiconductor Field Effect Transistors) in the submicrometer region, the trade-off between the electrical performance of the devices and the reliability of the devices becomes a major issue. The performance of MOSFET devices is characterized by parameters such as drive current and speed. Drive current is defined as the current per micrometer width for an NMOS and PMOS transistor with maximum allowed voltages (=supply voltage for a given gate length technology) on gate and drain for the minimum allowed gate length in that specific technology. Speed is the maximum operational frequency as measured by the delay of an invertor ring oscillator at the supply voltage. The reliability of the device is determined by failure mechanisms such as dielectric breakdown, hot carrier degradation, electromigration, contact electromigration, stress migration, electrostatic discharge phenomena, latch-up, soft errors, radiation effects, corrosion, stability of interfaces, charge spreading, and mechanical stress. To overcome reliability problems arising from hot carrier effects in MOSFET devices with submicrometer gate lengths, adaptations in the fabrication process of the devices should be implemented. These adaptations in the processing sequence will lead to new device structures. A conventional approach is to implant a lowly doped region adjacent to the drain and source regions before spacer definition. Such devices are known as Lowly Doped Drain region devices (LDD devices).

Despite the fact that the supply voltage has been reduced from 5 V to 3.3 V and even to 2.5 V when scaling down the channel length of LDD MOSFET's below 0.6 $\mu$m, hot-carrier degradation still remains a stringent limitation to the reliability of deep-submicron devices. To reduce the lateral electric field in NMOS LDD devices the concentration of the n-region between the channel and the $n^+$-junction should be lowered. Unfortunately this decrease in $n^-$-concentration results in a higher series resistance $R_s$, less current driveability, and an enhanced sensitivity of the device to the build-up of negative charge in the spacers during operation. This negative charge build-up causes an additional series resistance increase that leads to a severe drive current degradation. Therefore, in the optimization of conventional LDD transistors there exits a trade-off between the electrical performance on the one hand and the hot-carrier reliability on the other. To overcome this limitation various alternative device structures have been proposed in the past, such as LATID, inverse-T and GOLD in which the gate overlaps the $n^-$-region to minimize the series resistance and its increase during degradation, R. Izawa, et al., "Impact of the Gate-Drain Overlapped Device (GOLD) for Deep Submicrometer VLSI", IEEE Trans on Electr. Dev. vol. ED-35, p. 2088, 1988; T. Hori, et al., "Deep-Submicrometer Large-Angel-Tilt Implanted Drain (LATID) Technology", IEEE Trans on Electr. Dev. vol. ED-39, p. 2312, 1992; T. Y. Huang, et al., "A Novel Submicron LDD Transistor with Inverse-T Gate Structure", IEDM Techn. Dig., p. 642, 1986. However, for these devices complex processing is required and the transistors can suffer from channelling or shadowing effects.

SUMMARY OF THE INVENTION

The present invention relates to semiconductor devices in which the gate fully overlaps lowly-doped extensions of the source and the drain, as well as methods of fabricating such devices. In this new approach, called FOND (Fully Overlapped Nitride Etch Defined Device), the overlap between the gate and the source and the drain is well controlled through the use of nitride spacers. The nitride or oxide spacers define the dimensions of the gate. In turn, the gate acts as a mask to protect these lowly-doped source and drain extensions from being doped in a subsequent implantation step. The use of FOND architecture increases the lifetime of the semiconductor by two to three orders of magnitude. This increased lifetime is the result of the decreased generation of hot carriers in the channel of the device and of the decreased effect of damage caused by hot carrier degradation on the action of the FOND devices.

A. The FOND Process

The FOND process is fully compatible with standard CMOS processes. The CMOS process with FOND is similar to a CMOS process with standard LDD up to polysilicon gate deposition and doping. Only a few additional process steps are required to implement this device structure. The new steps are related to the gate patterning and the implantation of the lowly doped part of the source and drain regions.

After doping of the polysilicon gate and anneal, a nitride layer is deposited on top of the polysilicon, followed by a thin Si layer which acts as an etch protection layer for further dry etchings and improves the quality of the lithography step which forms the NMOS and the PMOS transistor gates. This thin Si layer together with the nitride is patterned, using the designed gate mask or reticle. A dry etching of the nitride defines the actual transistor channel.

After stripping the resist of the gate mask, the lowly doped source and drains are implanted. For the NMOS devices an n-type implantation, preferably Phosphorous, and for the PMOS a p-type implantation, preferably Boron, between about $1\times10^{13}$/cm2 and about $5\times10^{14}$/cm2 is used. This implantation is done through the polysilicon and reaches the surface of the Si region. The nitride spacer defines the dimensions of the gate and prevents impurities from coming directly into the channel. After this implantation a thin LPCVD nitride is deposited which is then anisotropically etched to form well controlled spacers. A thin Si layer on top of the nitride acts as an end-point detection layer for the dry etching of the nitride spacers. The thickness of this last nitride defines the dimension of the spacers. The first nitride together with the nitride spacers form a masking layer for etching the polysilicon, which is the gate material of the MOS transistors. This procedure guarantees a self-alignment between the channel region and the source/drain regions. In this approach an overlap of the etched polysilicon over the already implanted regions is guaranteed without an additional temperature step after the implantation of these lowly doped source/drain regions.

The etching of the polysilicon layer is followed by a wet removal of both the nitride spacers and the initial nitride layer. In this way, the resulting devices are free of layers which are non-standard in LDD CMOS technologies. The nitride layers are used solely for the purpose of making the lowly doped source/drain extensions.

Alternative versions of FOND fabrication are available, depending on the characteristics of the transistors being fabricated. In one version, the removal of the nitride and nitride spacers is followed by formation of oxide or nitride spacers. Thereafter, implantation is performed to define the source and drain regions which are adjacent to the lowly-doped source and drain extensions respectively. The thickness of this source/drain spacer can be changed to create an additional offset between the highly doped source/drain regions and the lowly doped source/drain regions. In this approach, the size of the spacer can be chosen in such a way that the highly doped junction reaches the polysilicon edge, without danger of increased electrical field. This is possible because of the overlap of the polysilicon over the LDD region. In contrast, this configuration is impossible in a standard LDD type of transistor, because if the highly doped source/drain region reaches the polysilicon edge, the LDD impurity profile will increase, resulting in an increased leakage of the transistor and an increased electrical field and leading to a lower hot carrier lifetime for the transistors.

In a second version of FOND, the source and drain regions are implanted prior to formation of the oxide or nitride spacers. In this approach, where the junction is implanted before the oxide or nitride spacer, the LDD region, which is overlapped by the polysilicon gate, is defined independently from the oxide or nitride spacer. In standard LDD CMOS technologies, the oxide or nitride spacers are necessary for both separating the junction and LDD region and for avoiding silicidation bridging. In the FOND devices, the oxide or nitride spacer is included solely to avoid silicidation bridging. Thus, in FOND devices, the oxide or nitride spacer dimension can be increased to avoid silicide bridging without significant increase of the transistor resistance.

The rest of the CMOS process, after the oxide spacers (in the case where the highly doped source/drain regions are implanted after the oxide spacer), or after silicidation or inter-level dielectric deposition (in the case where the highly doped source/drain junction is implanted before the oxide spacers), remains identical to standard LDD type of CMOS process.

B. The FOND devices

The electrical performance and the hot-carrier degradation behavior of a new type of fully overlapped device called FOND (Fully Overlapped Nitride-Etch Defined Device) was analyzed and compared to that of conventional LDD devices. Similar current driveability was found for the FOND devices compared to conventional LDD devices, although in the FOND devices significantly smaller concentrations are used for the lightly doped $n^-$-regions. For the overlapped device, a higher gate and overlap capacitance was found, originating from the larger polysilicon length and self-alignment of the junction implant to the polysilicon. For identical voltage conditions, this was reflected in a somewhat lower ring oscillator speed, compared to conventional LDD devices. Deep submicron FOND devices can easily exceed the lifetime of conventional LDD devices by two orders of magnitude. Based on experimental and simulation results, the increased reliability is explained by a reduction in hot-carrier injection and a lower sensitivity of the over-lapped device to hot-carrier damage. For the NMOS transistors, the lower generation of damage is the result of the lower lateral electric field due to the low $n^-$ concentration and the overlap of the polysilicon gate on the $n^-$ region while the suppressed sensitivity is due to the complete overlap. Compared to conventional LDD devices, the use of fully overlapped devices creates a wider process and reliability margin that can be used to optimize other electrical parameters.

The FOND approach may be utilized in transistors having small gate lengths. For example, FOND transistors may have gate lengths of about 0.5 $\mu$m or smaller, about 0.35 $\mu$m, about 0.25 $\mu$m, about 0.8 $\mu$m, about 0.12 $\mu$m, or about 0.07 $\mu$m.

C. Advantages of the FOND process and FOND devices

The lowly doped part of the transistor structure, the source/drain extensions, are well controlled and have an implantation profile, the dimensions of which are independently variable. This is a result of the use of nitride spacers to define the gate. In conventional devices, the lowly-doped source/drain extensions are formed by ion implantation in combination with a heating step which results in a diffusion profile of the source/drain extensions. Therefore, in conventional LDD devices, the depth and lateral dimensions of the LDD source drain extensions cannot be varied independently from one another.

In contrast, the FOND process allows independent control of the depth and lateral dimensions of the source and drain extensions. This is achieved through the use of nitride spacers, which define the dimensions of the gate. In a subsequent implantation step, the gate serves as a mask to prevent further doping of these lowly-doped source/drain extensions. Thus, the nitride spacers define the lateral dimensions of the lowly-doped source and drain extensions. In addition, different versions of the FOND process allows implantation which creates the highly doped source and drain regions to occur either before or after the formation of oxide or nitride spacers.

FOND provides a controlled overlap of the polysilicon over the lowly doped regions of the source/drain junction (i.e. the source and drain extensions) without an increase in leakage current. At the same time, FOND devices reach the same drive current specifications as standard LDD transistors.

Furthermore, FOND devices have a hot carrier lifetime two or more orders of magnitude greater than those obtained with the standard LDD transistors.

The FOND transistor can be used at a higher supply voltage than the LDD transistor for the same hot carrier lifetime, resulting in a higher speed. In fact, FOND devices can operate at higher voltages while maintaining a lifetime of 10 years. The FOND device architecture allows system engineers to maintain a higher supply voltage for FOND devices compared to the supply voltage of the conventional LDD CMOS devices. For example, FOND devices can be operated at 3 V in a 0.25 $\mu$m CMOS technology.

FOND also allows the use of lower concentration levels in the lowly doped source/drain extensions leading to reduced lateral fields without loss of current driveability.

Several other features and advantages of the FOND devices and processes will become apparent from the description below.

DETAILED DESCIPTION OF THE PREFERRED EMBODIMENTS

Figure 1A:
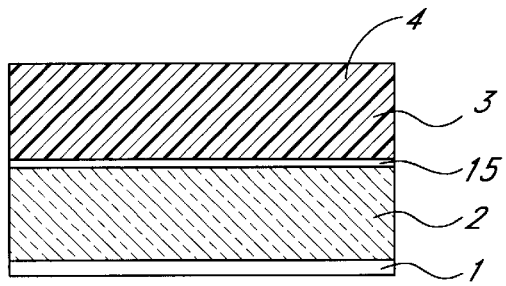
FIG. 1 shows the fabrication sequence for FOND devices.
Figure 1B:
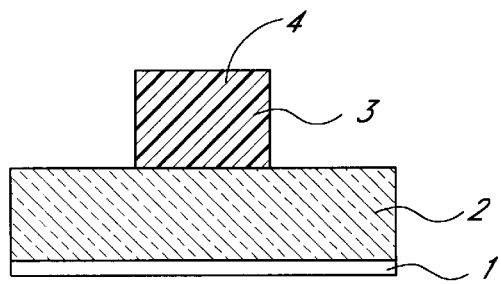
Figure 1C:
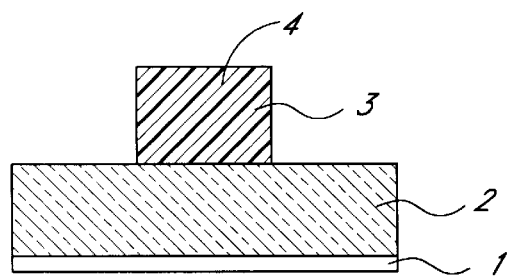
Figure 1D:
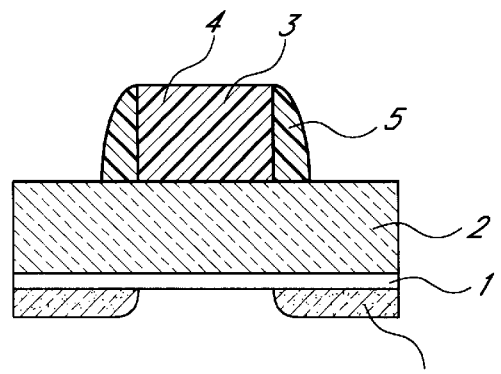
Figure 1E:
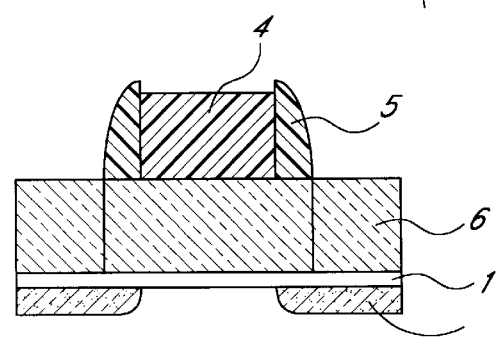
Figure 1E:
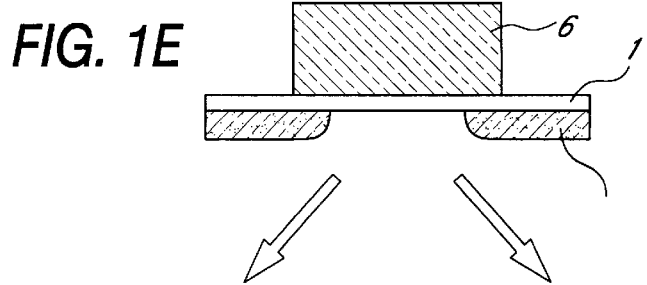
Figure 1F:
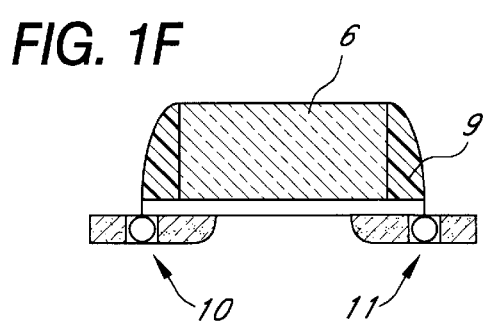
Figure 1G:
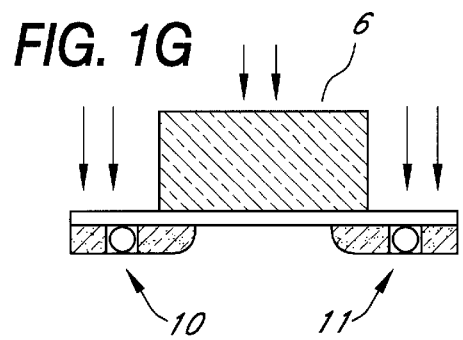
Figure 1H:
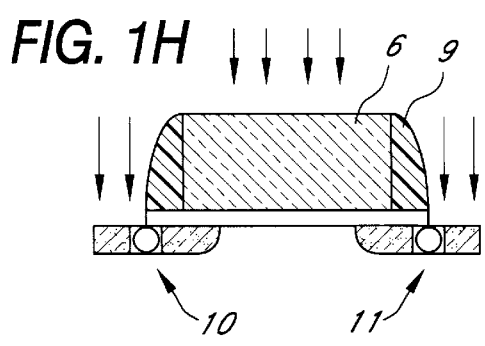
Figure 1I:
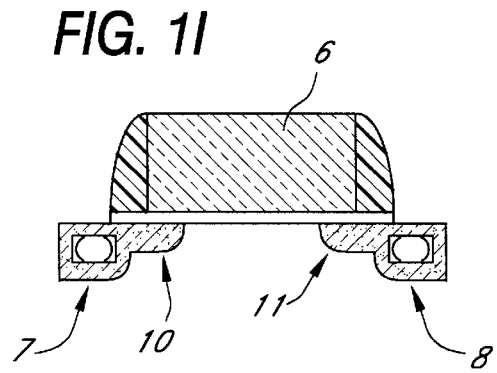
Figure 1J:
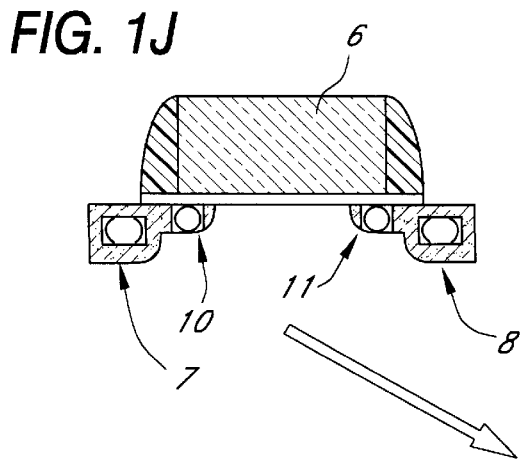
Figure 1K:
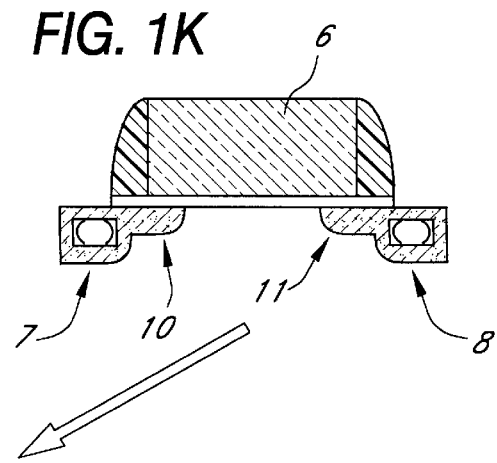

The present invention relates to a new transistor structure called FOND (Fully Overlapped Nitride-Etch Defined) in which the gate-drain overlap can be controlled independently of the implant conditions. The processing sequence for fabrication of FOND devices is also disclosed.

Below, numerical modeling results are provided for LDD and overlapped LDD (FOND) n-channel MOSFET's and the electrical characteristics and speed performance of FOND devices processed in both 0.35 μm and 0.25 μm CMOS technologies are disclosed. The advantages of FOND devices with respect to hot-carrier degradation are disclosed along with the trade-off between performance and reliability.

A. PROCESSING OF FOND DEVICES

The devices used in the following examples are LDD and FOND (Fully Overlapped Nitride-Etch Defined Device) MOSFET's fabricated in both 0.35 μm and 0.25-μm n⁺/p⁺ polysilicon CMOS technologies. Semiconductor gate lengths are directly related to the wavelength of the source used in the lithography steps during fabrication of the device. For example, ultraviolet wavelengths of 0.365 micron and 0.248 micron can be used to fabricate semiconductors having gate lengths of approximately 0.35 μm and 0.25 μm respectively. Ultraviolet wavelengths of 0.248 or 0.193 may be employed to fabricate semiconductors having gate lengths of approximately 0.18 μm. Alternatively, the lithography steps may be performed using sources other than ultraviolet light such as electron beams or soft X-rays. Although the following examples are based on fabrication of CMOS devices having gate lengths of about 0.35 μm and about 0.25 μm, those skilled in the art will appreciate that the present invention is not limited to those gate lengths. For example, the present FOND technology can also be employed in the context of CMOS devices having smaller gate lengths, such as about 0.18, about 0.12, and about 0.07 μm. Relevant technological parameters are listed in Table 1 below.

TABLE 1

Technological parameters of the 0.35 μm and 0.25 μm FOND process.

|  | 0.35 μm | 0.25 μm |
|---|---|---|
| gate oxide thickness | 8 nm | 6 nm |
| polysilicon thickness | 250 nm | 200 nm |
| first nitride thickness | 250 nm | 250 nm |
| n⁻ implant (species, dose, energy) | | |
| FOND 1 | P $1 \times 10^{14}$cm⁻² 150 KeV | P $1 \times 10^{14}$cm⁻² |
| FOND 2 | P $8 \times 10^{13}$cm⁻² 170 KeV | 110 KeV |
| FOND 3 | P $1 \times 10^{14}$cm⁻² 170 KeV | |
| ref. LDD | P $5 \times 10^{13}$cm⁻² 20 KeV | As $8 \times 10^{13}$cm⁻² 20 KeV |
| nitride spacer thickness | 120 nm | 100 nm |

FIG. 1 depicts the processing of FOND devices in the context of CMOS technology. A gate oxide (1), preferably 8 nm thick, is grown. Thereafter a 250 nm thick polysilicon layer (2) is deposited. After polysilicon layer (2) doping and anneal, a first nitride layer (3) is deposited on top of the polysilicon. Preferably, the first nitride layer is a $Si_3N_4$ layer. A silicon oxide layer (15) may optionally be deposited on the polysilicon layer (2). This oxide layer is deposited if an etch-stop layer is required in between the polysilicon layer and the subsequent layer. A thin Si layer (4) can be deposited on the polysilicon layer (2) or on the optional etch-stop layer (15). This thin Si layer (4) acts as an etch protection layer for further dry etchings and improves the quality of the lithography step which defines the NMOS and PMOS transistor gates. The thin Si layer (4) together with the first nitride is patterned using the designed gate mask or reticle. Deep UV, i-line, or other lithographic techniques can be used, and a dry etching of the first nitride defines the actual transistor channel. After stripping the resist off the gate mask, the lowly doped source and drains are implanted. For the NMOS devices a high energy n-type implantation (preferably Phosphorous) and for the PMOS a high energy p-type implantation (preferably Boron) between $1\times10^{13}/cm^2$ and $5\times10^{14}/cm^2$ is used. Using this implantation step an appropriate definition and doping of the source/drain lowly-doped extensions underneath the gate polysilicon is obtained. This implantation is done through the polysilicon (2) and reaches the surface layers of the Si substrate. After implantation a heating step for annealing the implantation damage is performed. Preferentially the annealing step is performed for 30 minutes at 850° C. Different implant conditions have been implemented giving a lower surface concentration in the $n^-$-region than the reference LDD (Table 1).

After the implantation a thin LPCVD second nitride is deposited which is then anisotropically etched to form well controlled spacers (5). The thin Si layer (4) on top of the first nitride (3) acts as an endpoint detection layer for the dry etching of the nitride spacers (5). The first nitride together with the nitride spacers (2) form a masking layer for etching the polysilicon (2). The etching step si performed by RIE etching. The etched polysilicon layer (6) is the gate of the FOND transistor, as in conventional MOS transistors. This procedure results in a self-alignment between the channel region and the source/drain regions. The width of the nitride spacers (5) defines the gate-drain/source overlap. Following the process steps described above, an overlap of the etched polysilicon gate (6) over the already implanted regions is obtained without the need for an additional diffusion step by heating after the implantation and anneal of the implantation damage of these lowly doped source drain regions. Therefore, the lateral dimension of the lowly-doped region is independent of the depth of the lowly doped region. The etching of the polysilicon layer is followed by a wet removal of both the nitride spacers and the initial nitride layer. Therefore, the resulting FOND device is composed only of layers that are normally present in conventional LDD type transistors of CMOS technologies. Both nitride layers are dispensable and are included solely for the purpose of making the lowly doped source/drain structure self-aligned to the channel in combination with an ensured overlap of the polysilicon gate (6) over these regions.

Depending on the context in which the above-described process is employed, the removal of the nitride layers (3) and (5) can either be followed by the definition of oxide or nitride spacers (9) or can directly be followed by shallow junction definition by an additional implant which creates source/drain regions (7) and (8) for the transistors. If the source/drain junctions are implanted after the oxide or nitride spacer (9) is formed, the thickness of the source/drain spacer (9) can be changed to create an additional offset between the highly doped source/drain regions (7) and (8) and the lowly doped source/drain extensions (10) and (11). Using this approach, the gate does not overlap the highly doped portions of the source and drain, although it does overlap the lowly doped source and drain extensions. The oxide or nitride spacers (9) prevent silicidation at the edges of the polysilicon gate (6) and therefore prevent bridging during silicidation.

In the approach where the junction is implanted before the oxide or nitride spacer (9) is defined, the LDD region (10) and (11), which is overlapped by the polysilicon gate (6) is defined independently from the oxide or nitride spacer (9). Using this approach, the gate partially overlaps the highly doped portions of the source and the drain, and fully overlaps the lowly doped source and drain extensions. The oxide or nitride spacer (9) is necessary in standard LDD CMOS technologies for separating the junction from the LDD region and for avoiding silicidation bridging, while in the FOND technology it is only meant for avoiding silicidation bridging. Consequently, the oxide spacer (9) dimensions can be increased to avoid silicide bridging without significant increase of the transistor resistance. The steps after silicidation or inter level dielectric deposition in this approach are identical to the standard LDD CMOS process.

In the approach where the junction is implanted after the oxide spacer is defined, the size of the spacer (9) can be chosen in such a way that the highly doped junction reaches the edge of the polysilicon gate (6). In this approach there is no danger of an increased electrical field due to the ensured overlap of the polysilicon gate (6) over the LDD region. This would not be possible for a standard LDD type transistor because if the highly doped source/drain region (7) and (8) reaches the polysilicon edge, an increased leakage of the transistor and an increased electrical field will result, leading to a shorter hot carrier lifetime for the transistors. The steps after definition of the oxide spacers in this approach are identical to the standard LDD CMOS process.

B. NUMERICAL MODELING RESULTS WITH FOND DEVICES

To study the influence of the gate-drain overlap and the $n^-$-concentration on the performance and the reliability of the MOS devices, modeling with MINIMOS 6, was employed, P. Habas, R. Bellens, G. Groeseneken, "A Model Study of the Hot-Carrier Problem in LDD and Overlapped LDD MOSFET's", Microelectronic Engineering, p. 285, 1995. Both the Monte Carlo and the drift-diffusion transport model were applied. All simulated n-channel devices had identical geometrical parameters, well-implants and $n^+$ source/drain implants (As, $5\times10^{15}$ $cm^{-2}$, 70 keV). The $n^-$-implant dose (P, 20 keV) was varied resulting in different surface $n^-$-concentrations in the LDD region. The dopant profiles for the LDD devices were obtained by the two-dimensional SUPREM-4 simulations. In the device simulations the dopant profiles of the overlapped LDD devices were identical to the ones of the conventional LDD but the $n^-$-region was completely overlapped by the gate at the source and drain sides. This was done to evaluate the effect of the overlap exclusively. The width of the overlapped region was 150 nm in all cases, the polysilicon-gate length was 0.4 µm and the oxide thickness was 7.6 nm. The simulated LDD device with $n^-$-profile with the highest surface concentration ($2.5\times10^{18}$ $cm^{-3}$) corresponds to a device of the 0.35-µm LDD technology discussed in, J. P. Mieville, G. Van den bosch, L. Deferm, R. Bellens, G. Groeseneken, H. E. Maes, W. Schoenmaker, "FOND (Fully Overlapped Nitride-Etch Defined Device): a New Device Architecture for High-Reliability and High-Performance Deep Submicron CMOS Technology", IEDM Techn. Dig., p. 83, 1994, while the overlapped LDD with the low $n^-$-concentration ($7.5\times10^{17}$ cm$^{-3}$) closely resembles an actual FOND device.

1. Drive Current

Figure 2:
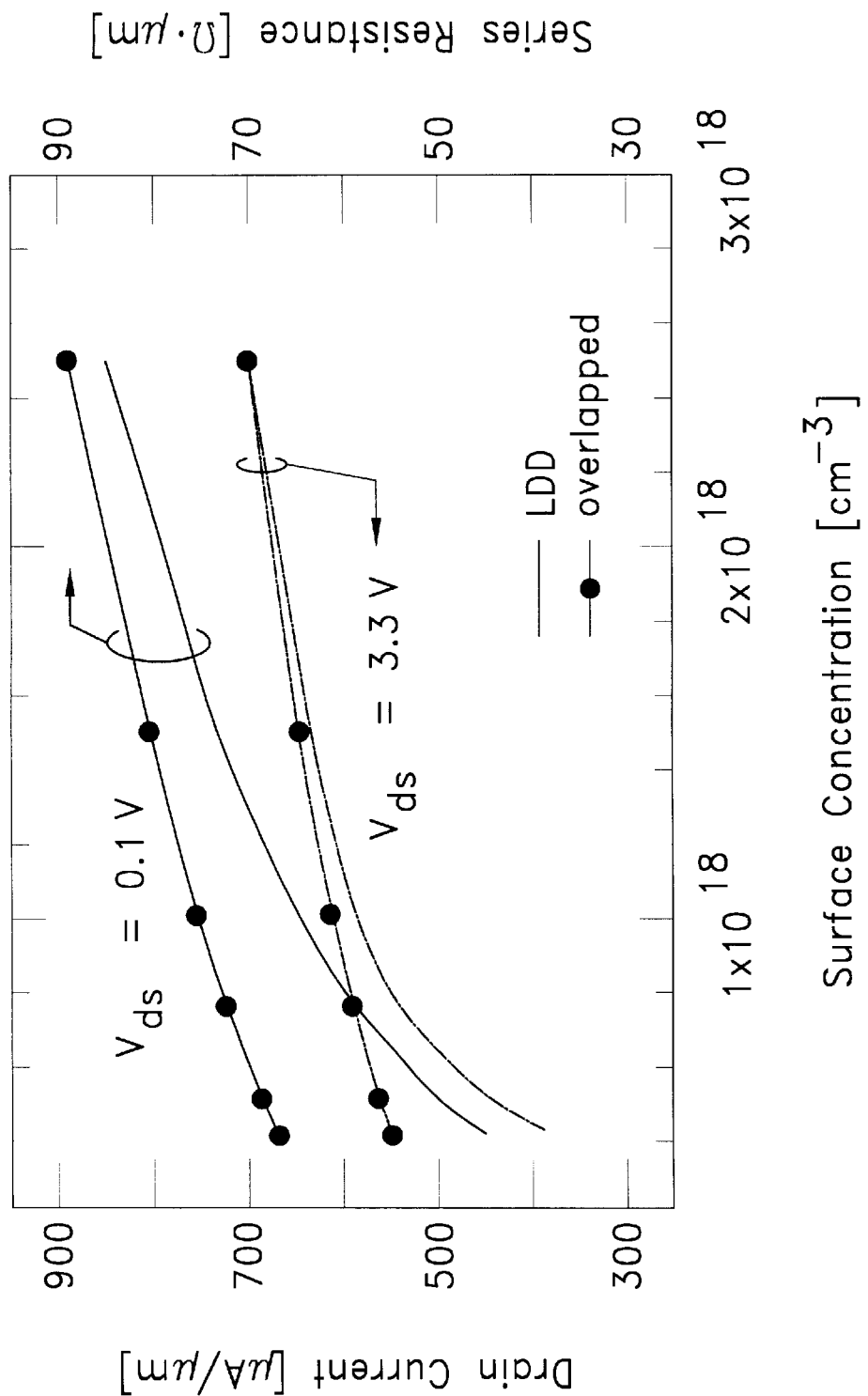
FIG. 2 shows the calculated current at $V_{gs}$=3.3 V for 6 LDD and overlapped LDD devices demonstrating the effect of the channel length and of the drain and source series resistances.

In FIG. 2, the linear ($V_{ds}$=0.1 V) and saturation current ($V_{ds}$=3.3 V), numerically calculated with MINIMOS 6 for V gs=3.3 V, are plotted as a finction of the surface concentration in the $n^-$-region for both the LDD and overlapped LDD devices. For the LDD devices a significant roll-off of the drain current is observed at lower $n^-$-concentration. Moreover, the roll-off is higher for the linear current $I_{dlin}$ than for the saturation current ($I_{dsat}$) since for $I_{dsat}$ only the source-side series resistance is of importance and the dependence of $I_{dsat}$ on effective channel length $L_{eff}$ is weaker than that of $I_{dlin}$ in short channel devices. When the $n^-$-region is overlapped by the gate the reduction in both $I_{dlin}$ and $I_{dsat}$ is suppressed and can be explained by the $L_{eff}$ dependence. Consequently, the effect of the overlap on the drive current is more pronounced in the linear than in the saturation current. From FIG. 2 it is also clear that for the same surface concentration higher drive currents are obtained in the overlapped devices than in the LDD devices. This means also that to reach a given drive current a lower $n^-$-concentration can be used in the overlapped devices.

2. Effective Electron Temperature and Impact Ionization

For the different dopant profiles the electron temperature $T_e$ and the impact ionization rate are computed at the stress bias $V_{ds}$=4.4 V, $V_{gs}$=1.7 V using a self-consistent Monte Carlo (MC) model. The results presented hereafter are also qualitatively confirmed by employing the conventional drift-diffusion (DD) approach.

Figure 3A:
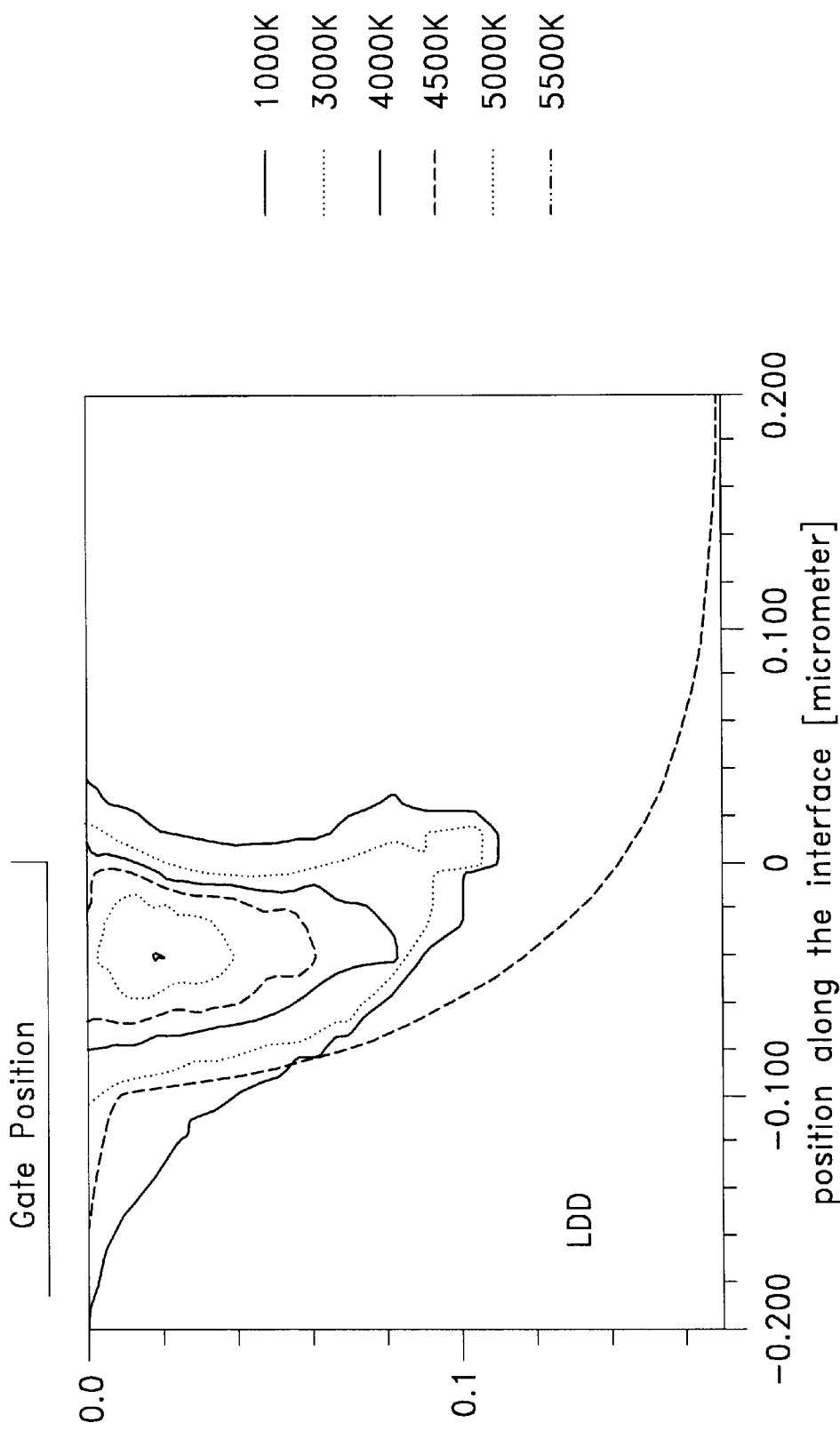
FIG. 3a shows the electron temperature in a LDD device with $n^-$-implant dose $5.0 \times 10^{13}$ cm$^{-2}$, surface n⁻-concentration at the gate edge $2.5 \times 10^{18}$ cm⁻³, at the stress bias: $V_{ds}$=4.4 V, $V_{gs}$=1.7 V. The drain junction and position of the gate are denoted. In this device with high n⁻-concentration the peak $T_e$ is located in the gate/LDD-subdiffusion region.
Figure 3B:
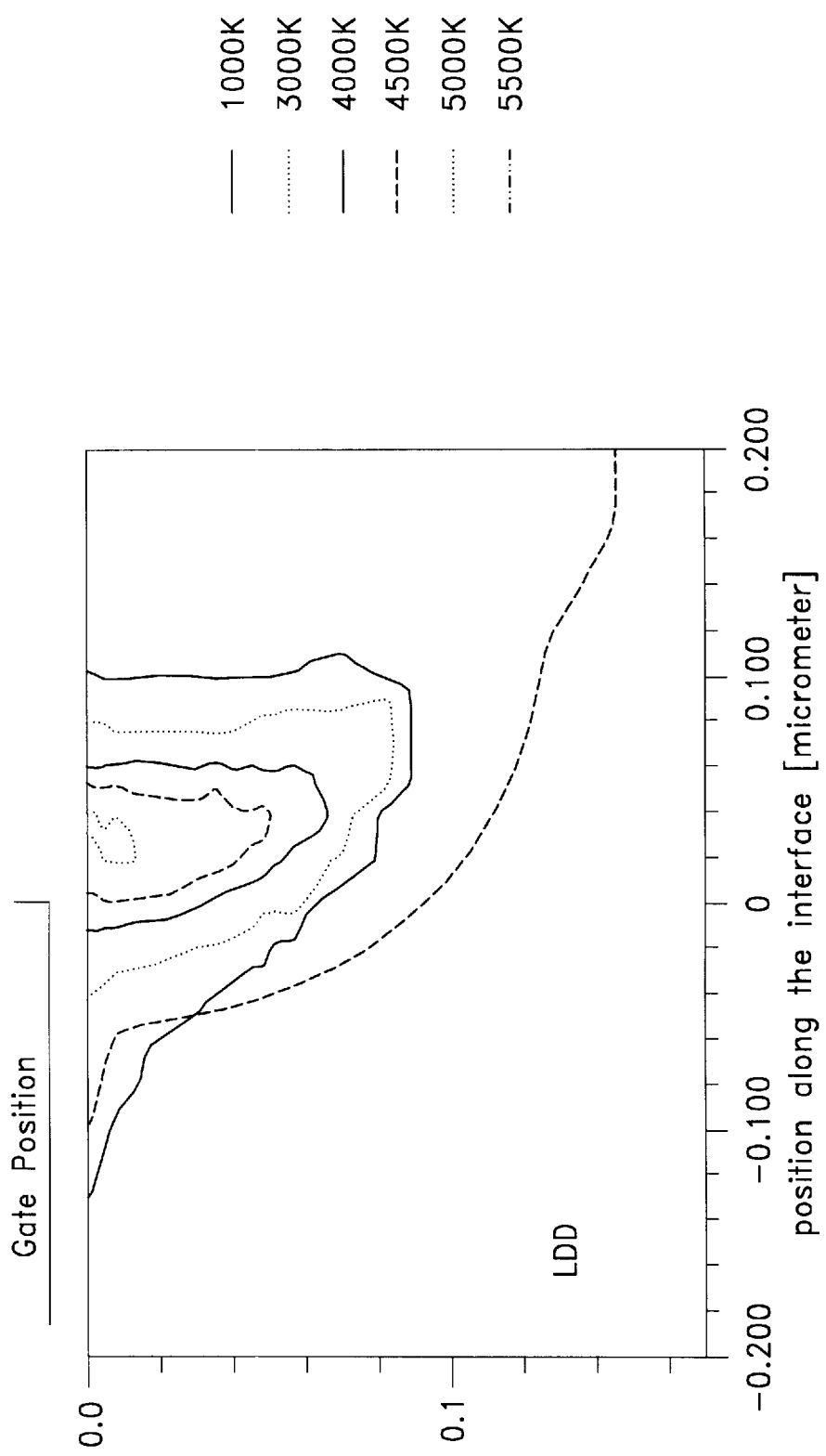
FIG. 3b shows electron temperatures in a LDD device with n⁻-dose $1.5 \times 10^{13}$ cm⁻², n⁻-concentration $7.5 \times 10^{17}$ cm⁻³, $V_{ds}$=4.4 V, $V_{gs}$=1.7 V. In this lowly doped device the peak $T_e$ is located close to the interface under the spacer oxide.
Figure 4A:
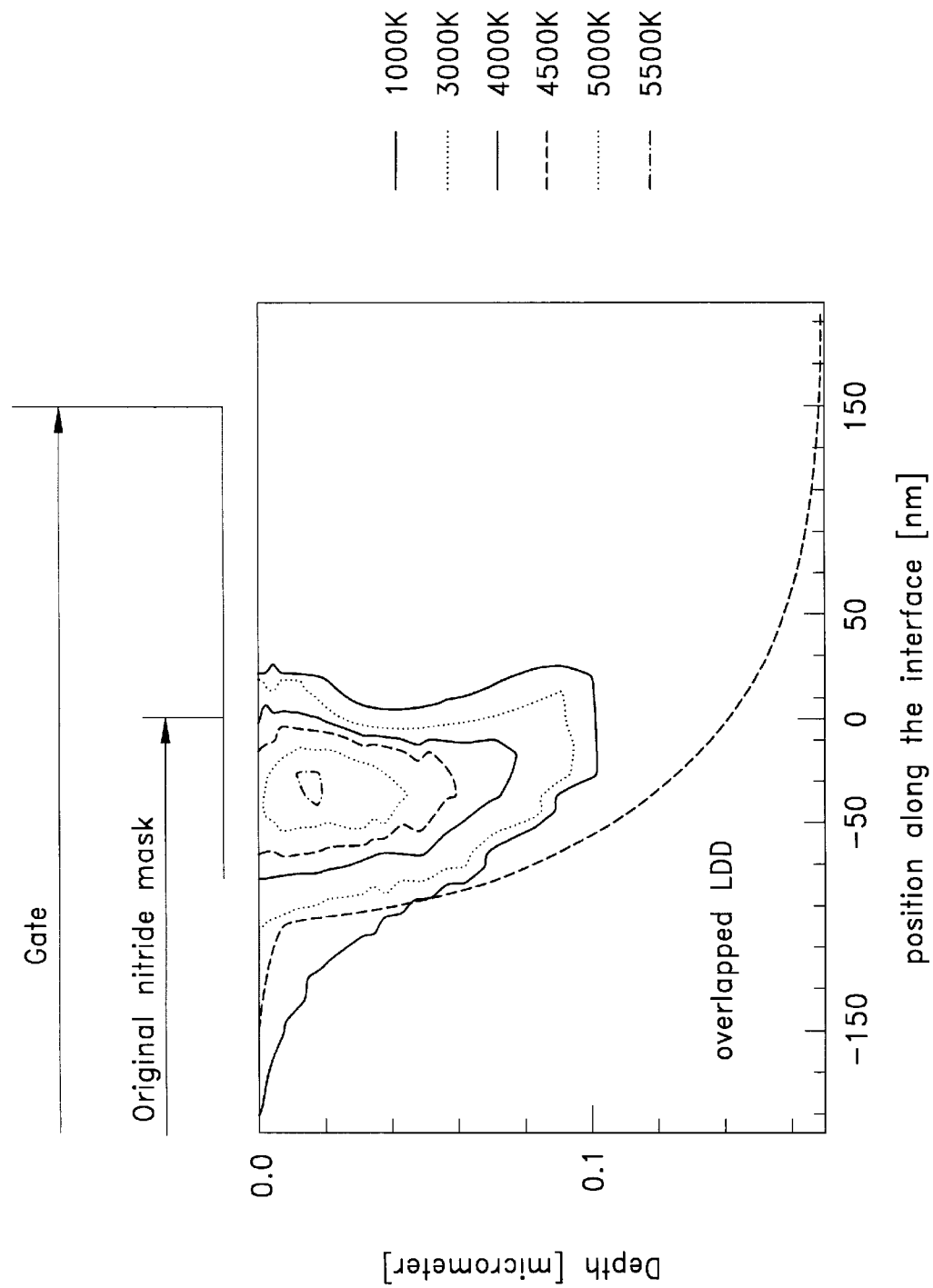
FIG. 4a shows electron temperature in an overlapped LDD device with n⁻-implant dose $5.0 \times 10^{13}$ cm⁻², n⁻-concentration $2.5 \times 10^{18}$ cm⁻³, $V_{ds}$=4.4 V, $V_{gs}$=1.7 V. Compared to FIG. 3a the overlap has minor impact on the $T_e$-distribution.
Figure 4B:
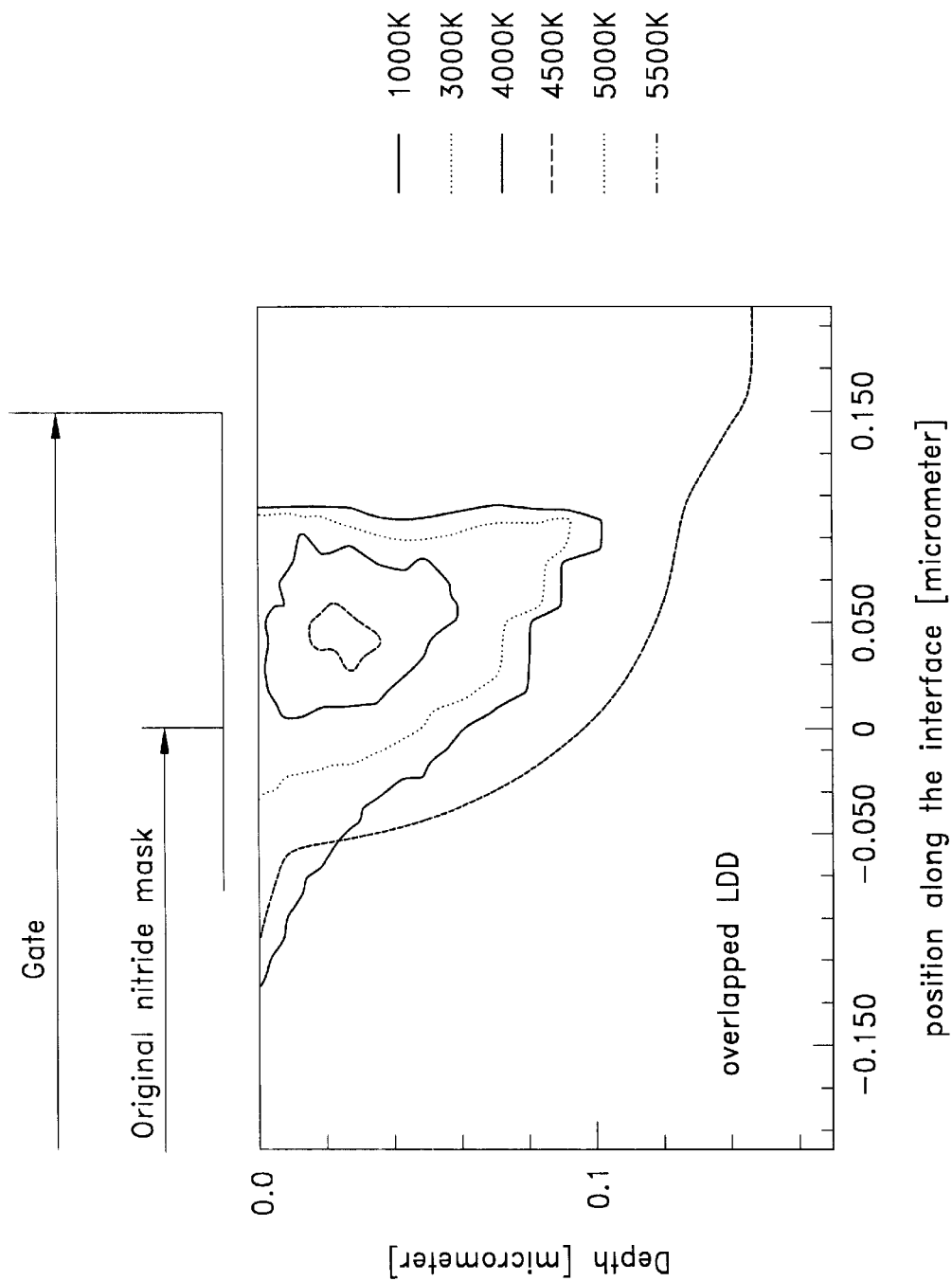
FIG. 4b shows electron temperature in an overlapped LDD device with n⁻-dose $1.5 \times 10^{13}$ cm⁻², n⁻-concentration $7.5 \times 10^{17}$ cm⁻³, $V_{ds}$=4.4 V, $V_{gs}$=1.7 V. With respect to FIG. 3b, the $T_e$-peak is lower, shifted towards the drain contact and pushed away from the silicon/silicon dioxide interface.

FIGS. 3 and 4 show the spatial distribution of the electron temperature in the LDD and overlapped LDD devices for two different $n^-$-concentrations. It is clear from FIG. 3 that for the LDD devices a decrease in the $n^-$-concentration results in a decrease of the maximum electron temperature and a shift of $T_e$-peak towards the $n^+$ drain junction. With a high $n^-$-concentration, the peak electron temperature and the peak of the avalanche multiplication are located in the gate/subdiffusion region, but for the low $n^-$-concentrations they move to positions under the spacer. Moreover, the $T_e$-peak and the peak of the avalanche multiplication also shift towards the interface with a decrease of the $n^-$-concentration. Therefore, at low $n^-$-concentration the combination of the previous effects will lead to enhanced injection into the spacer and series resistance increase. For the overlapped devices a decrease of the $n^-$-concentration also results in a decrease of the electron temperature and a shift of the peak-$T_e$ towards the $n^+$ drain junction (FIG. 4). Contrary to the non-overlapped device, the peak also shifts deeper into the bulk of the device.

When the modeling results of the LDD (FIG. 3) and the overlapped LDD (FIG. 4) devices were compared at identical surface concentrations, it was found that the effect of the overlap is to cause a decrease in electron temperature, a shift of the hot area towards the $n^+$ drain junction, and a shift of the $T_e$-peak from the interface into the bulk of the device. This results from the absence of the $n^-$-field peak (due to the gate edge) and the smoothness of the overall lateral field distribution near the interface in the overlapped LDD Since the peak of the electron temperature and that of the impact ionization are located further away from the interface, less hot-electron injection will occur in the overlapped devices compared to the non-overlapped LDD, even at equal multiplication.

Figure 5:
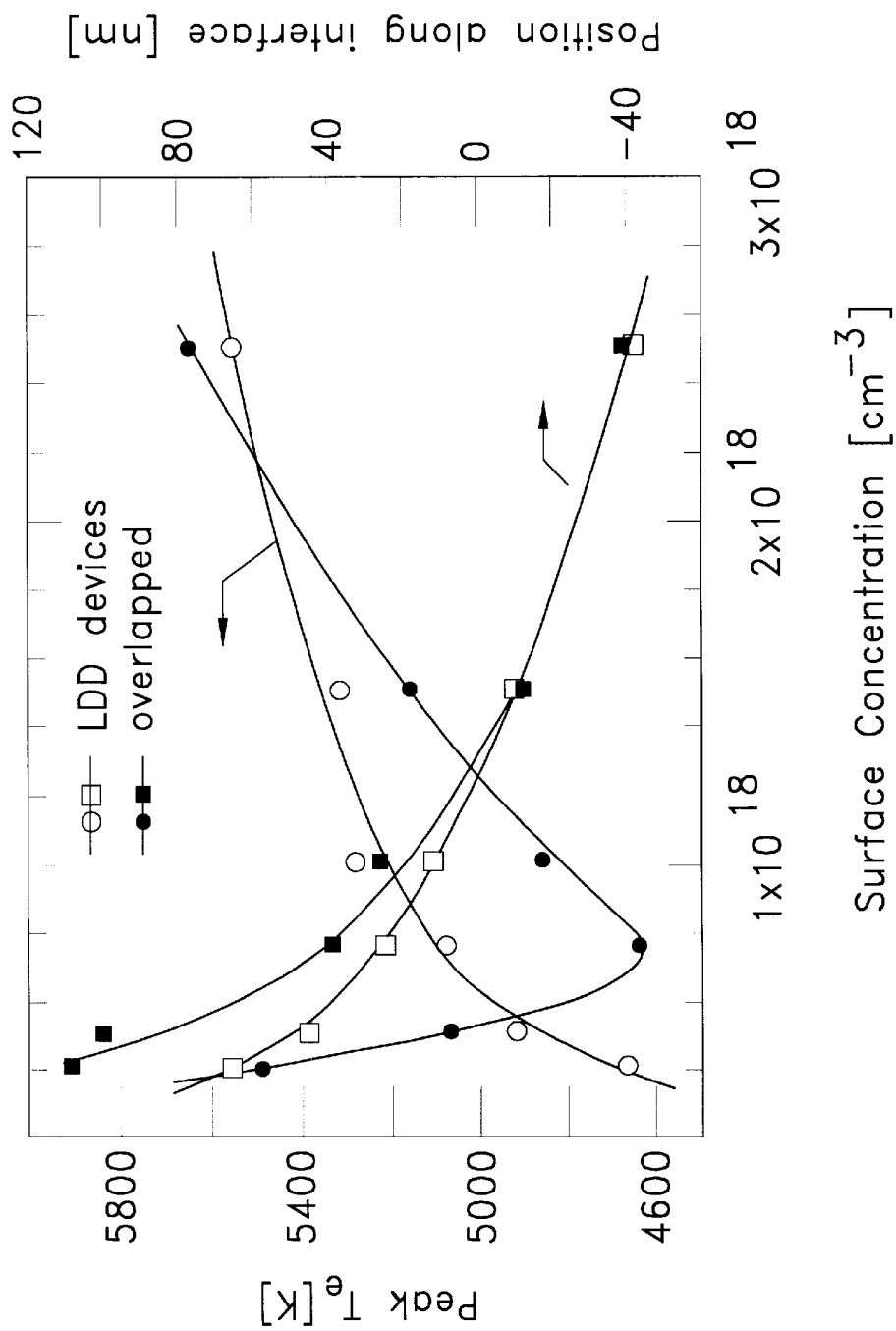
FIG. 5 shows the peak value of $T_e$ and its position calculated by Monte-Carlo model (MINIMOS 6) for $V_{ds}$=4.4 V, $V_{gs}$=1.7 V. Position 0 refers to the LDD gate-edge; the overlapped LDD gate-edge is located at 150 nm.

Similar calculations as the ones in FIGS. 3 and 4 were performed for other $n^-$-concentrations, resulting in curves shown in FIG. 5. For overlapped LDD devices a minimal $T_e$-peak was found at an $n^-$-concentration of $7.5\times10^{17}$ cm$^{-3}$. This concentration also results in the minimal multiplication factor for the overlapped LDD devices. The optimum concentration in the LDD device is even lower than for the overlapped LDD.

Table 2 summarizes the results obtained for the $T_e$-peak and its location along the interface and into the bulk for two $n^-$-concentrations. The high $n^-$-concentration was equal to the surface concentration in the processed LDD (as measured with SIMS) while the low $n^-$-concentration corresponded to that of the FOND devices. For the location along the interface, the LDD structure was taken as a reference (see also FIG. 4). This means that for the LDD, a negative value corresponds to a position under the gate, zero is at the edge of the polysilicon gate, and a positive value corresponds to a position under the spacer. For the overlapped LDD the zero is at the same position as in the LDD, and in this case the edge of the polysilicon gate is situated at +150 nm.

TABLE 2

Numerical modeling results of LDD and overlapped LDD devices

| $n^-$-conc. (cm$^{-3}$) | $2.5\times10^{18}$ | $7.5\times10^{17}$ | |
|---|---|---|---|
| non-overlapped LDD | 5546 K | 5073 K | $T_e$-peak |
|  | −41 nm | 26 nm | position at interface |
|  | 19 nm | 9 nm | position in bulk |
| overlapped LDD | 5641 K | 4636 K | $T_e$-peak |
|  | −39 nm | 40 nm | position at interface |
|  | 18 nm | 19 nm | position in bulk |

3. Sensitivity to the Damage Generation

Figure 6A:
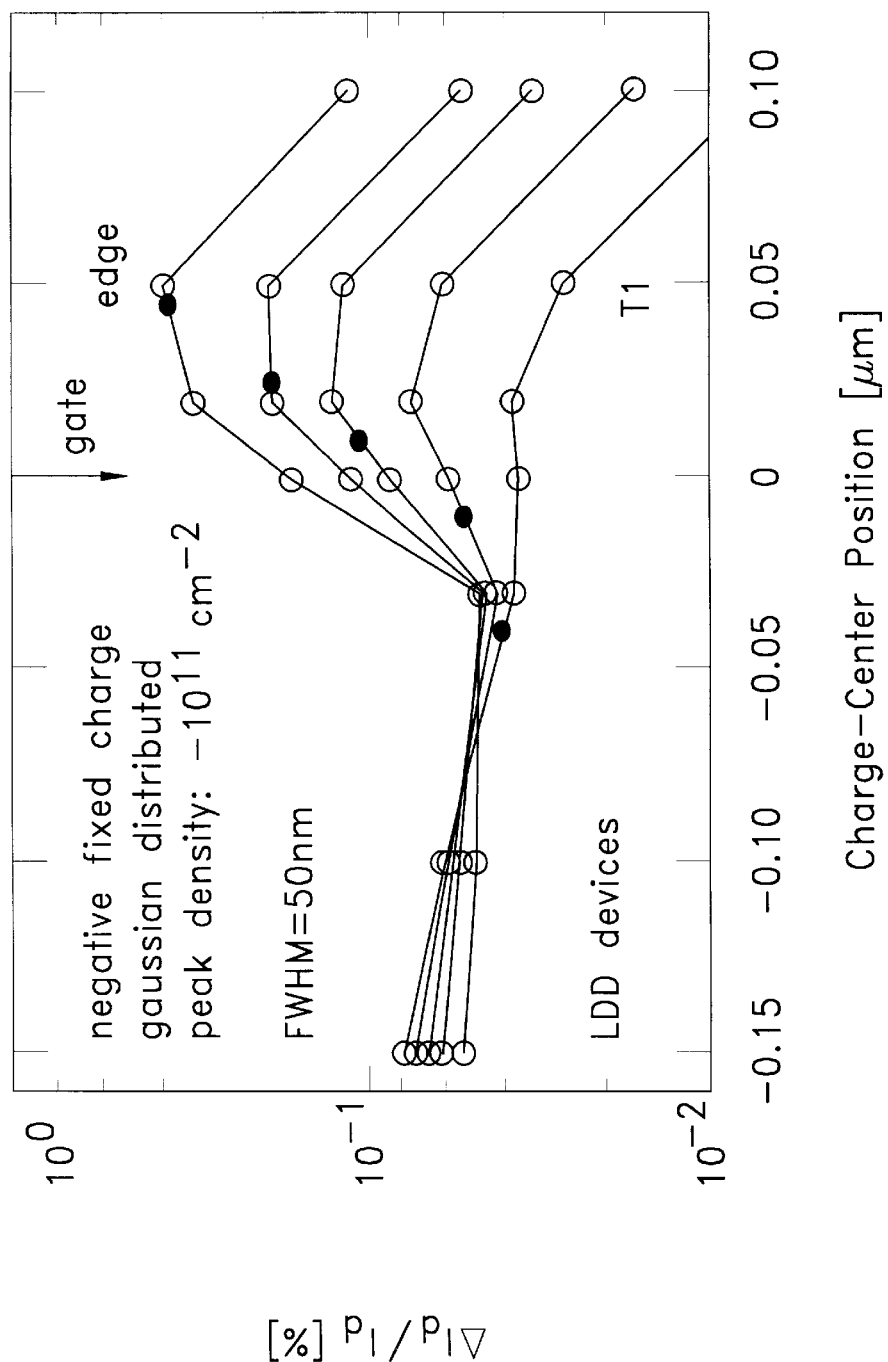
FIG. 6a shows numerically calculated drain current degradation at $V_{ds}$=0.1 V and $V_{gs}$=3.2 V in LDD devices for different positions of the damaged region (trapped electrons).

Next the sensitivity to the hot-carrier induced degradation of the LDD and overlapped LDD devices was studied. For this purpose, the linear drain current degradation was numerically calculated for a fixed distribution of localized acceptor-like interface traps and fixed negative oxide charge with and without accounting for the mobility reduction due to surface scattering. This calculation was repeated for several spatial positions of the damage. The results for the fixed negative charge (gaussian distribution with a peak density of $10^{11}$ cm$^{-2}$ and full width at half maximum FWHM=50 nm) are shown in FIG. 6a for the different LDD devices and in FIG. 6b for the overlapped LDD devices with different $n^-$-concentrations The solid points represent the positions where the peak electron temperature was located at the applied stress bias, as shown in FIG. 5.

Figure 6B:
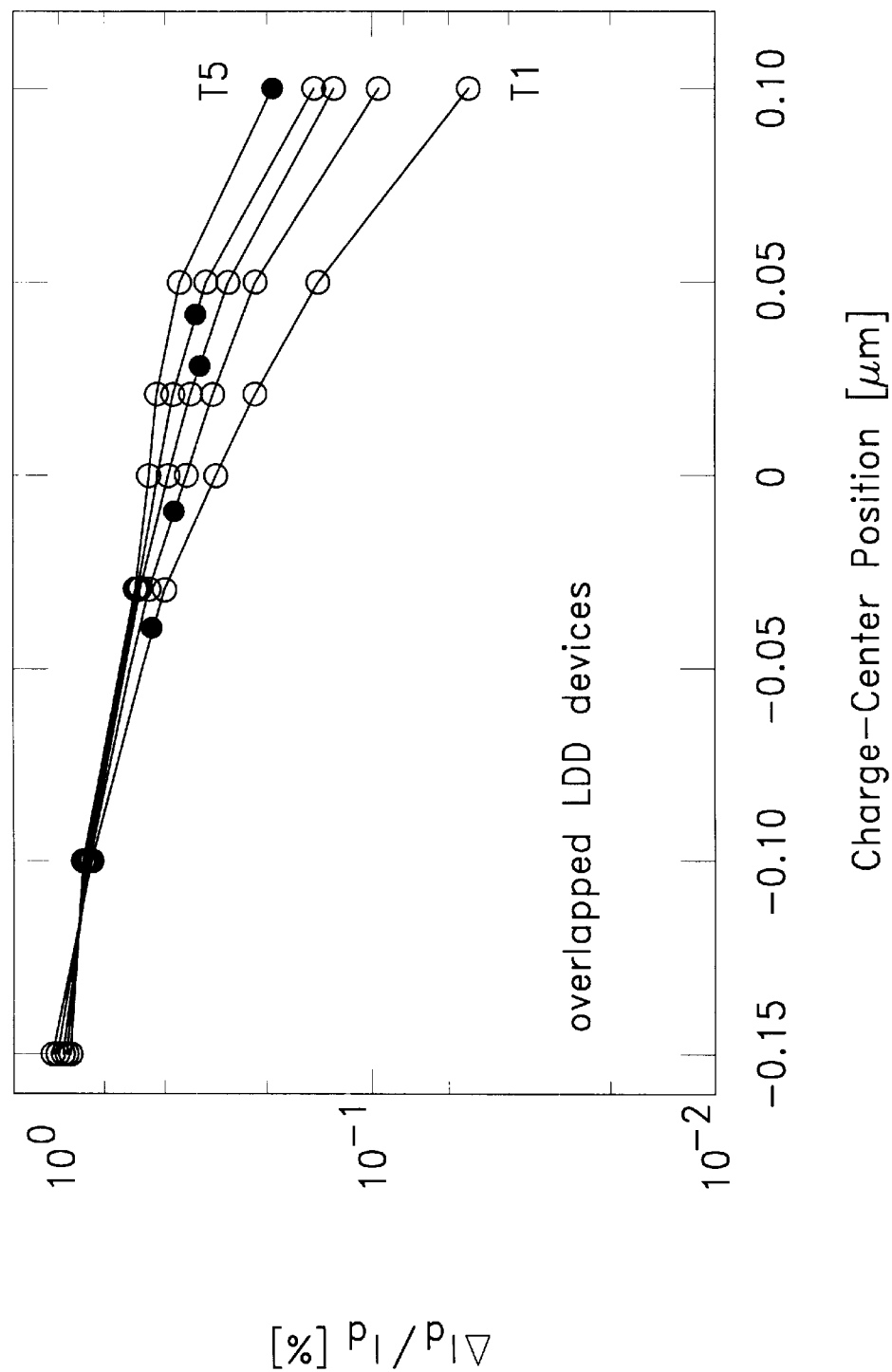
FIG. 6b is a similar calculation for overlapped devices. Solid points denote $T_e$-peak location shown in FIG. 5. The gate overlap strongly suppresses the high sensitivity of the degradation to the n⁻-concentration for the damage under the LDD spacer. The n⁻-implant doses and n⁻-concentrations at the gate edge (0) for the different devices are listed below. T1:$5.0 \times 10^{13}$ cm⁻², $2.5 \times 10^{18}$ cm⁻³, T2:$3.0 \times 10^{13}$ cm⁻², $1.5 \times 10^{18}$ cm⁻³, T3:$2.0 \times 10^{13}$ cm⁻², $1.0 \times 10^{18}$ cm⁻³, T4:$1.5 \times 10^{13}$ cm⁻², $7.5 \times 10^{17}$ cm⁻³, T5:$1.0 \times 10^{13}$ cm⁻², $5.0 \times 10^{17}$ cm⁻³.

Modeling clarifies that the I–V degradation of LDD and overlapped LDD changes with $n^-$-dose as a result of an interplay between various opposing effects: the change in $T_e$-peak level, $T_e$-peak location along and from the interface, the damage position and the dependence of the sensitivity to a certain amount of damage on the $n^-$-concentration, P. Habas, R. Bellens, G. Groeseneken, "A Model Study of the Hot-Carrier Problem in LDD and Overlapped LDD MOSFET's", Microelectronics Engineering, p. 285, 1995. With lower $n^-$-concentration, a higher current degradation is obtained for the LDD devices when the damage is placed in the spacer oxide (FIG. 6a) and it is exactly towards this position that the peak-$T_e$ shifts when one decreases the $n^-$-concentration (FIG. 5). It is important to keep in mind that, depending on the time behavior of the degradation, a small change in current degradation may result in a large lifetime difference. For the overlapped LDD devices the increase in the drain current degradation at lower $n^-$-concentration is completely suppressed due to the presence of the overlap (FIG. 6b). Moreover, a given amount of damage placed at the position where the $T_e$-peak is located (as indicated by the black dots on the figure) causes an approximately equal current degradation independent of n⁻-concentration.

From FIGS. 2 and 5, it can be concluded that for similar drive current specifications, one is able to use an overlapped LDD device with a smaller n⁻-concentration which has less hot-carrier injection and a reduced sensitivity to the generated damage.

C. ELECTRICAL PERFORMANCE OF FOND DEVICES

Figure 7:
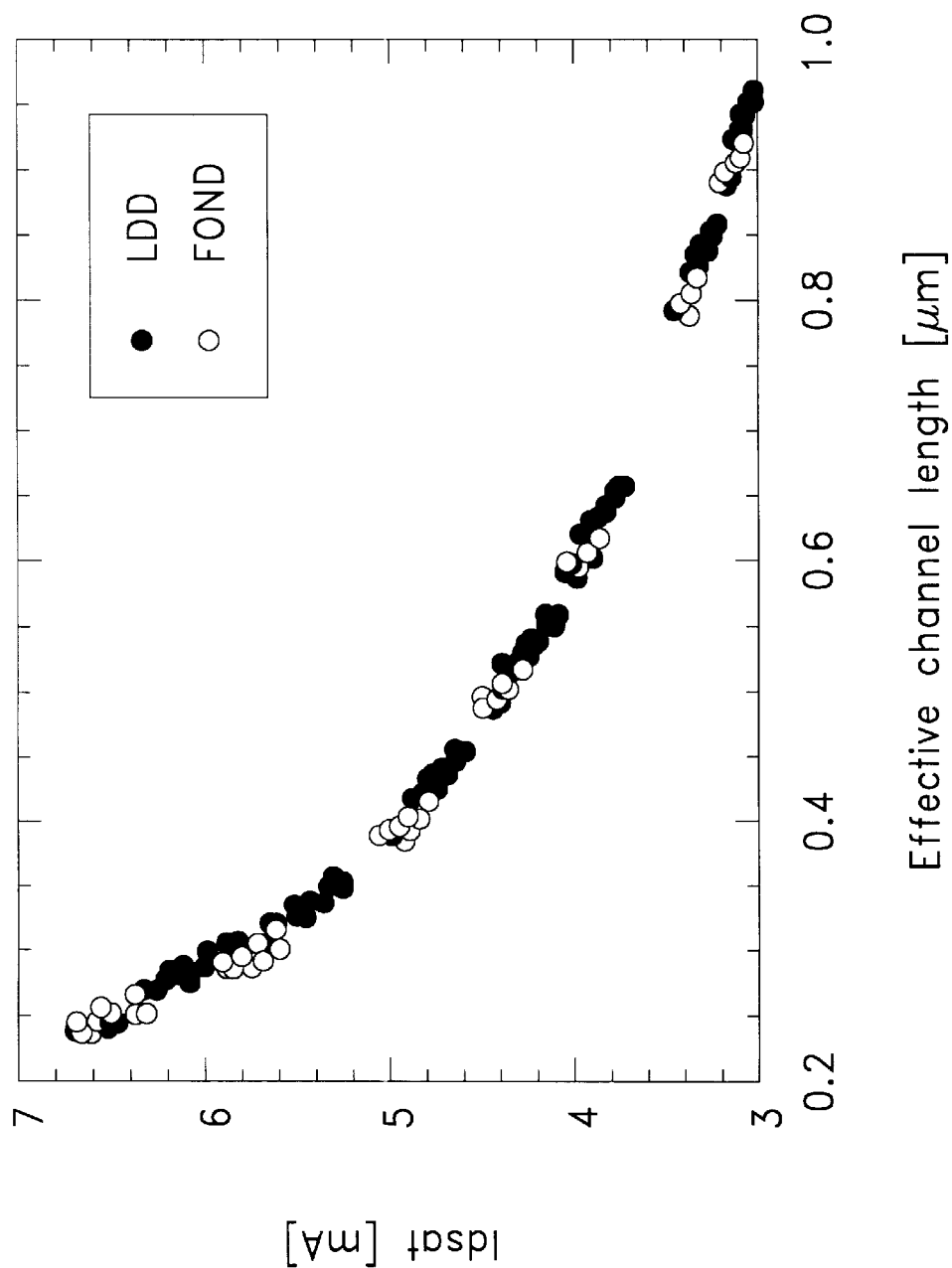
FIG. 7 shows the experimental saturation current ($V_{gs}$=$V_{ds}$=3.3 V) for FOND and LDD device architecture with W=10 μm.

FIG. 7 shows the drive current versus Leff of representative 0.35-μm n-channel LDD and FOND devices. At $L_{eff}$=0.35 μm, they have similar drive currents of 0.54 mA/μm for the n-MOSFET. As was discussed in the previous section, for identical n⁻-concentration and effective channel length a higher drive current is normally expected for the FOND device because the n⁻-region has a smaller resistance due to the electric field induced by the gate overlap. This allows a lower n⁻-concentration compared to standard LDD devices. In the FOND, the decrease of the current due to the lower n⁻-concentration and the increase due to the gate overlap partly compensate each other (FIG. 2) and FIG. 7 shows clearly that it is possible to have a lower concentration without decreasing the driveability with the FOND devices. This result is not in contradiction with the modeling results in FIG. 2 since in these calculations $L_{eff}$ is different for all devices (with decreasing n⁻-concentration $L_{eff}$ increases) while the experimental results devices with equal $L_{eff}$ were measured. If the currents for LDD and overlapped LDD with equal $L_{eff}$ are compared, the results in Table 3 are obtained, showing that a good agreement is found between the modeling and the experimental results.

TABLE 3

Comparison of measured and calculated drain current at identical effective channel length $L_{eff}$. Contact resistances are included in the calculation.

|  | $V_g$(V) | $V_d$(V) | measured $I_d$ (mA/μm) | calculated $I_d$ (mA/μm) |
| --- | --- | --- | --- | --- |
| LDD | 3.2 | 0.1 | 0.0623 | 0.0619 |
|  | 3.2 | 3.3 | 0.557 | 0.538 |
| FOND | 3.2 | 0.1 | 0.0594 | 0.0595 |
|  | 3.2 | 3.3 | 0.565 | 0.537 |

Gate capacitance characteristics have been studied by measuring the gate-to-drain/source capacitance $C_{gds}$ as a function of gate-to-source/drain bias $V_{gds}$, on short-channel transistors (designed gate length 0.4 μm) with a large width, fabricated in a 0.35-μm CMOS process, V. Kol'dyaev, A. Clerix, R. Murphy Arteaga, L. Deferm, "Characterization of the overlap capacitance of submicron LDD MOSFETs", Proc. ESSDERC, p. 757, 1995. Although we measured in the currentless regime with source and drain tied together, reasonable insight in the behavior of the actual gate-to-source and gate-to-drain capacitance under operating conditions can be gained. The measurement results are plotted in FIG. 8 for a n-FOND and n-LDD device, respectively. Similar characteristics have been obtained on p-channel devices. In the $C_{gds}$ versus $V_{gds}$ curve, different regions can be distinguished. In inversion ($V_{gds}>V_{th,channel}$) the total gate capacitance is measured, consisting of the intrinsic oxide capacitance $C_{ox}L_{eff}$, the parallel plate capacitance of drain and source overlap region (length $L_{ov}$) $2C_{ox}L_{ov}$ and the outer fringing capacitance $2C_{of}$. The total gate capacitance is significantly larger in the FOND device, which is to be attributed to its larger polysilicon length and consequently larger $L_{ov}$. The increase is proportional to the nitride spacer length, which is 120 nm in this particular example.

Figure 8:
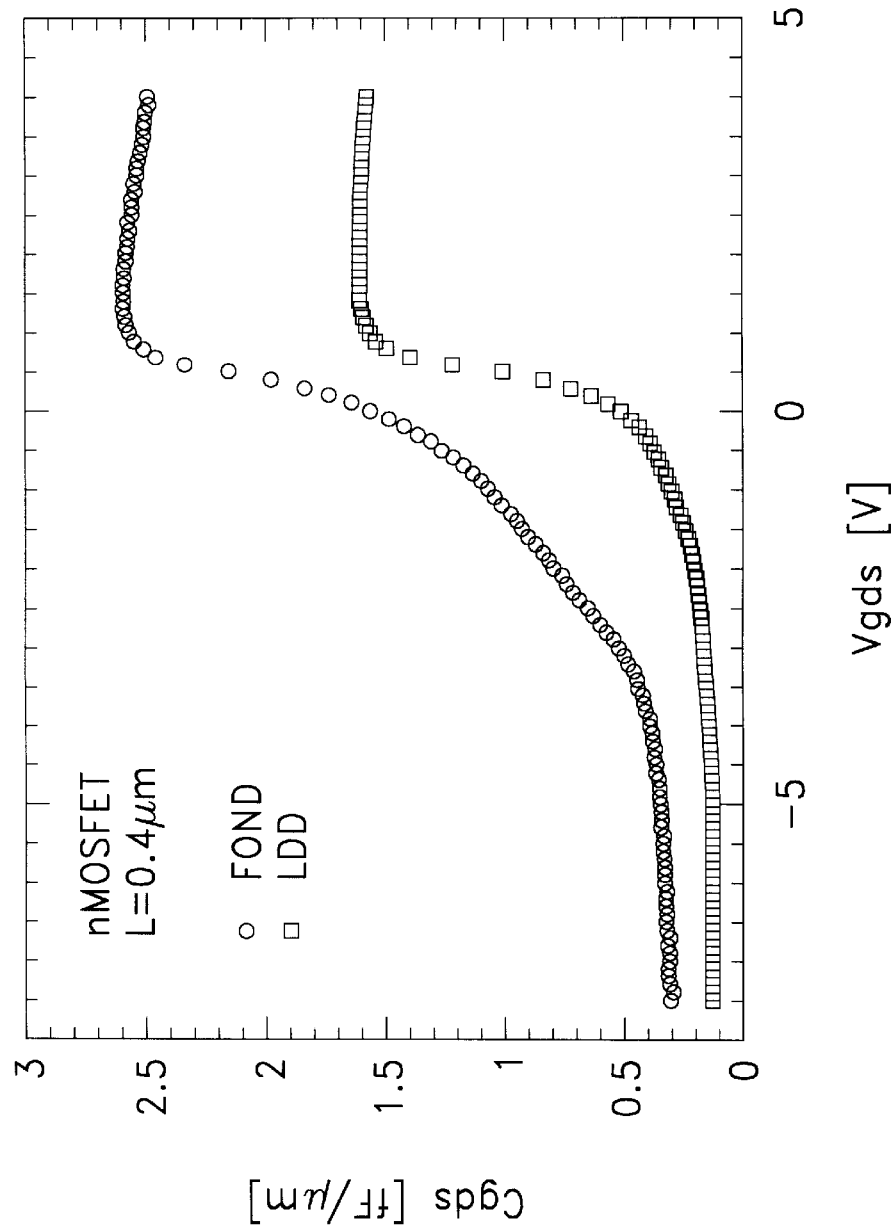
FIG. 8 plots the gate-to-drain/source capacitance as a function of gate-to-source/drain bias for FOND and LDD devices.
Figure 9:
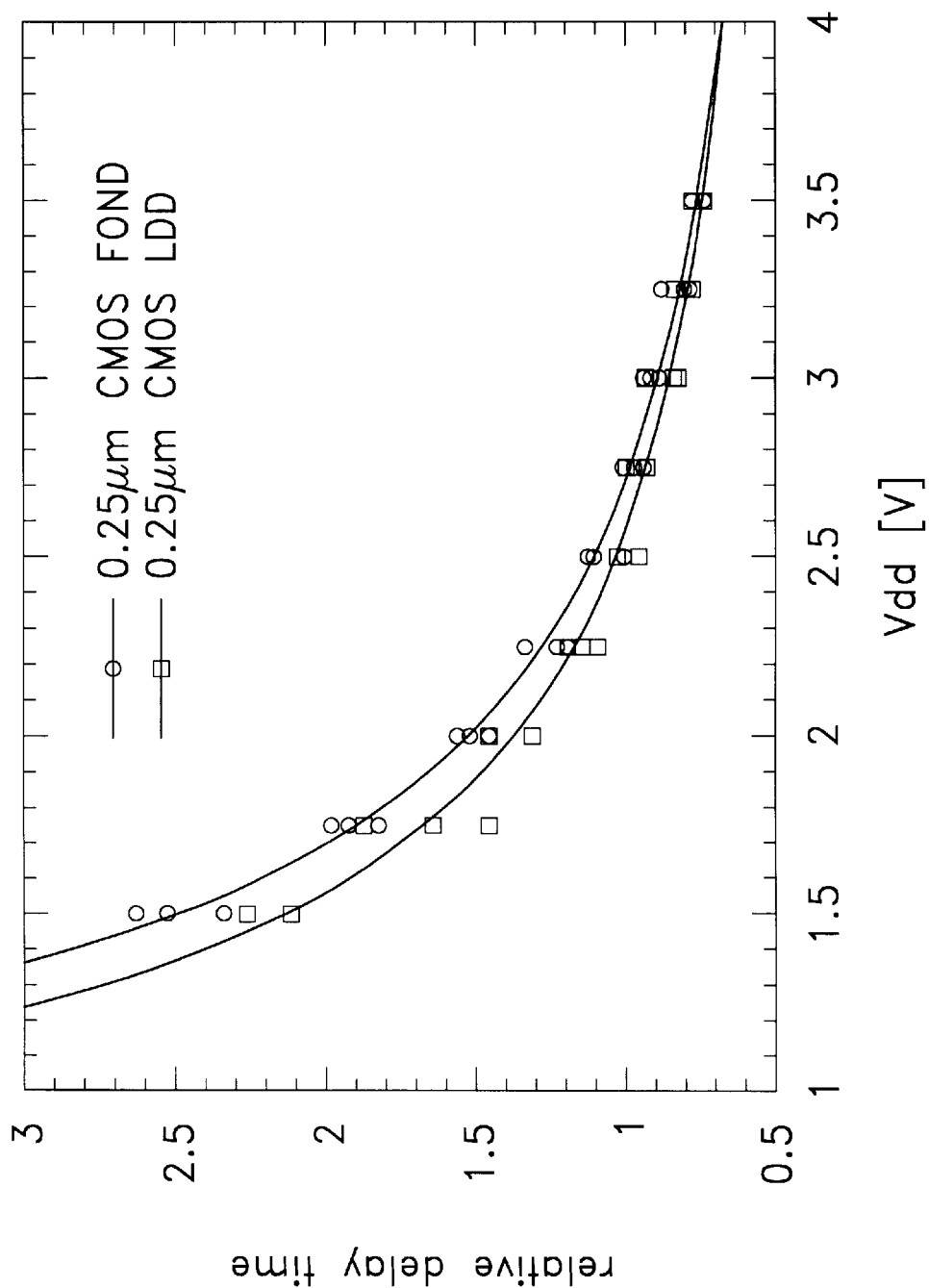
FIG. 9 shows the delay time (normalized to the delay time of the LDD technology at $V_{dd}$=2.5 V) of ring oscillators fabricated in a 0.25 μm technology (designed gate length 0.3 μm).

With $V_{gds}$ below $V_{th,channel}$ only the parasitic components of the gate capacitance contribute to $C_{gds}$. The overlap capacitance is significantly larger in the FOND device due to the larger overlap length. However, the effect of the extra overlap will be minimized under operating conditions, as the LDD region is depleted in the saturation regime, M. Inuishi, K. Mitsui, S. Kusunoki, H. Oda, K. Tsukamoto, Y. Akasaka, "Gate capacitance characteristics of gate/n⁻-overlap LDD transistor with high performance and high reliability", IEDM Techn. Dig., p. 371, 1991, T. Hori, Y. Odake, J. Hirase, T. Yasui, "Gate-capacitance characteristics of deep-submicron LATID (Large-Angle-Tilt Implanted Drain) MOSFET's", IEDM Techn. Dig., p. 375, 1991. With the channel strongly accumulated, $C_{gds}$ asymptotically approaches a minimum value. In a conventional LDD device (and in the currentless regime) this value is given by the outer fringing capacitance of the polysilicon edge to the source/drain region, as the LDD will be entirely depleted at large negative $V_{gds}$. However, in the FOND device, being fully overlapped, the minimum value is larger due to the contribution of the HDD region underneath the polysilicon, which cannot be depleted under normal working biases. This extra parallel plate capacitance is independent of the nitride spacer width and can only be avoided by realizing a partially overlapped device rather than a fully overlapped one. This is an essentially identical trade-off as the one encountered between a LATID and a no-spacer LATID device, T. Hori, Y. Odake, J. Hirase, T. Yasui, "Gate-capacitance characteristics of deep-submicron LATID (Large-Angle-Tilt Implanted Drain) MOSFET's", IEDM Techn. Dig., p. 375, 1991. FIG. 8, demonstrates that the FOND device has a larger capacitance than an LDD device in all working regimes. This larger capacitance for both n-channel and p-channel devices is expected to have an adverse effect on the speed performance of FOND technology. Delay times were measured in unloaded CMOS invertor-based ring oscillators fabricated in 0.35-μm and 0.25-μm FOND and conventional LDD devices. The results shown in FIG. 9 were obtained on ring oscillators fabricated in a 0.25-μm technology, with design gate length 0.3 μm, and nitride spacer width in the FOND of 100 nm. The drive current and the threshold voltage of the LDD and FOND devices were the same. Here, the data was normalized to the delay time of the LDD technology at $V_{dd}$=2.5 V to allow more convenient comparison. As expected, delay times were somewhat higher in the FOND oscillators, although the difference for these particular conditions is limited to about 10%. The loss in speed performance was reduced because not only the gate capacitance but also the drain junction capacitance determines circuit speed. It can be further reduced by decreasing the overlap, i.e. the nitride spacer width.

D. HOT-CARRIER DEGRADATION PERFORMANCE OF N-CHANNEL DEVICES

Figure 10:
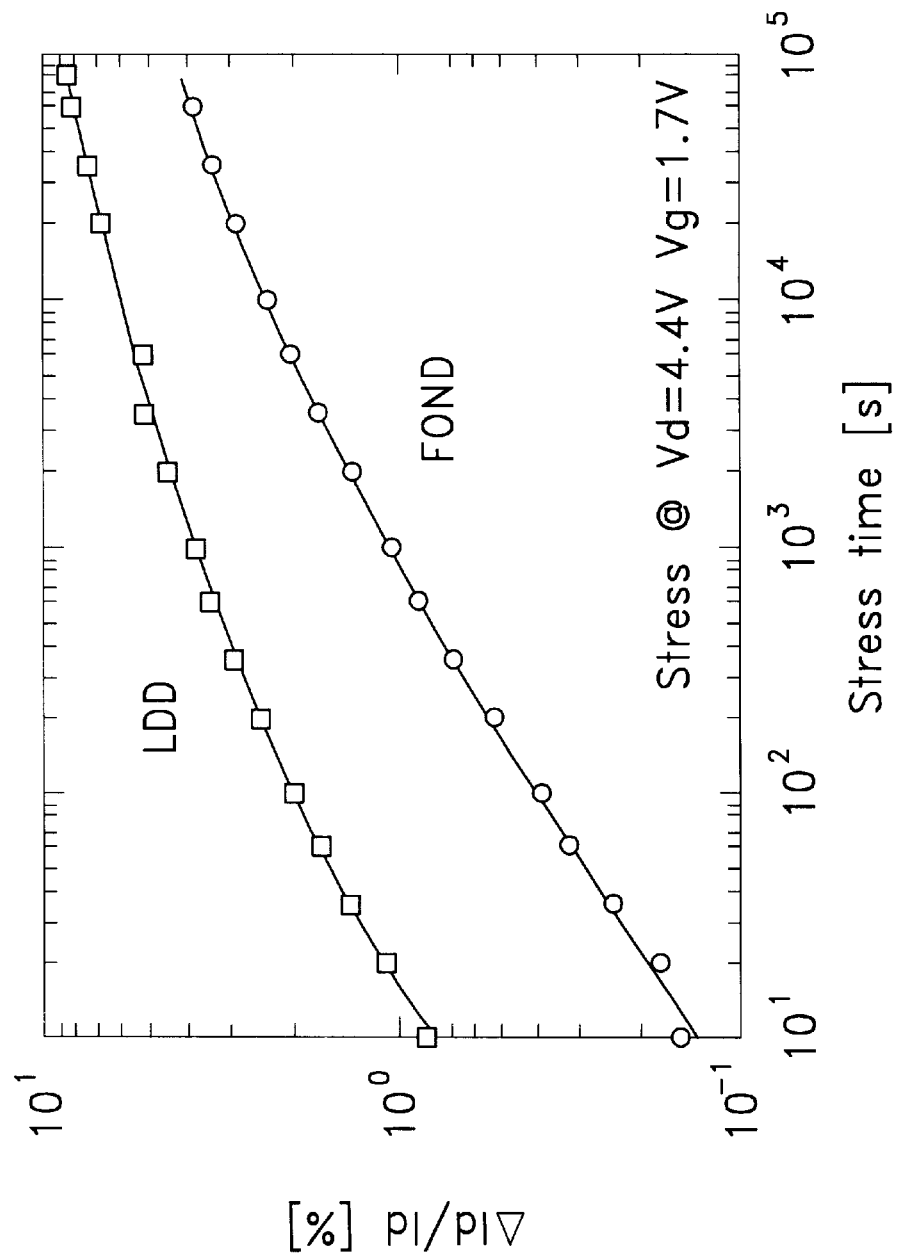
FIG. 10 shows the time dependence of the degradation of LDD and FOND. The degradation of the FOND is much smaller for identical stress voltage conditions.

FIG. 10 demonstrates that for devices with similar drive current, oxide thickness and effective channel length and for stresses at identical bias conditions, FOND devices exhibit a strongly reduced degradation compared to LDD devices. Based on the numerical modeling results three possible contributions to this enhanced hot-carrier resistance can be distinguished: 1) the lateral electric field and consequently $T_{e,max}$ is smaller in FOND than in LDD for identical bias conditions, 2) the amount of physical damage generated at identical lateral field conditions is smaller in FOND than in LDD, 3) FOND is less sensitive to damage, i.e. a given amount of physical damage (generated interface traps or fixed charge) has less impact on the I–V characteristics of a FOND device than on those of an LDD device. Experiments measuring the importance of these effects are described below.

Figure 11:
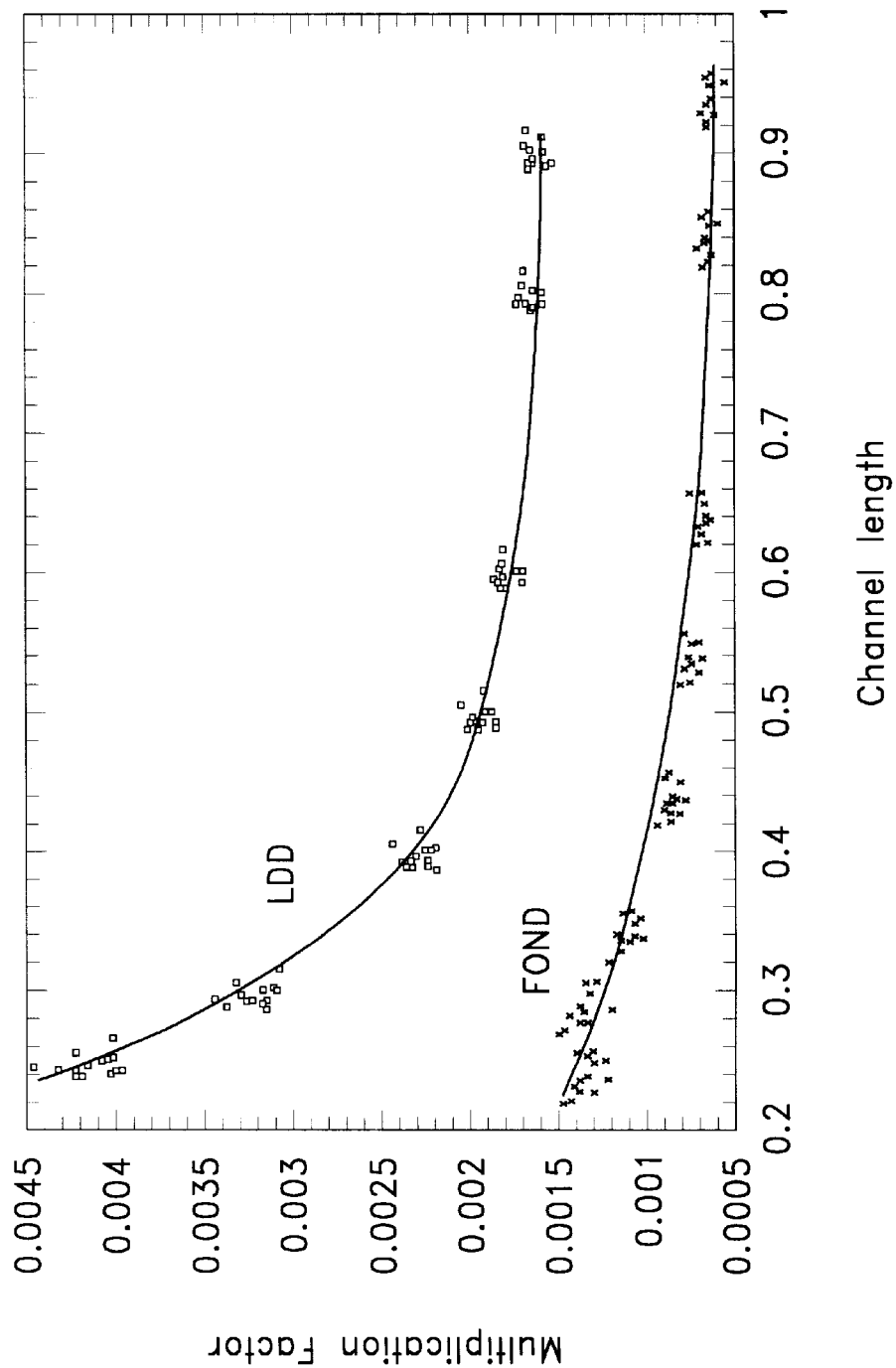
FIG. 11 shows the multiplication factor in FOND and LDD devices indicating that the lateral electric field is lower in FOND. The drive currents are the same in both devices.

In FIG. 11 the multiplication factor—and thus also the lateral electric field at the drain—for FOND and LDD were compared for identical bias conditions. The FOND device has a much lower electric field peak. This corresponds to the results found by the numerical modeling showing that the peak-$T_e$ and impact ionization are lower in overlapped LDD than in conventional LDD for properly chosen $n^-$-doses (FIGS. 4 and 5). Moreover, the point of maximum carrier multiplication was located deeper in the bulk of the overlapped device and will therefore give rise to less hot carrier injection.

Figure 12:
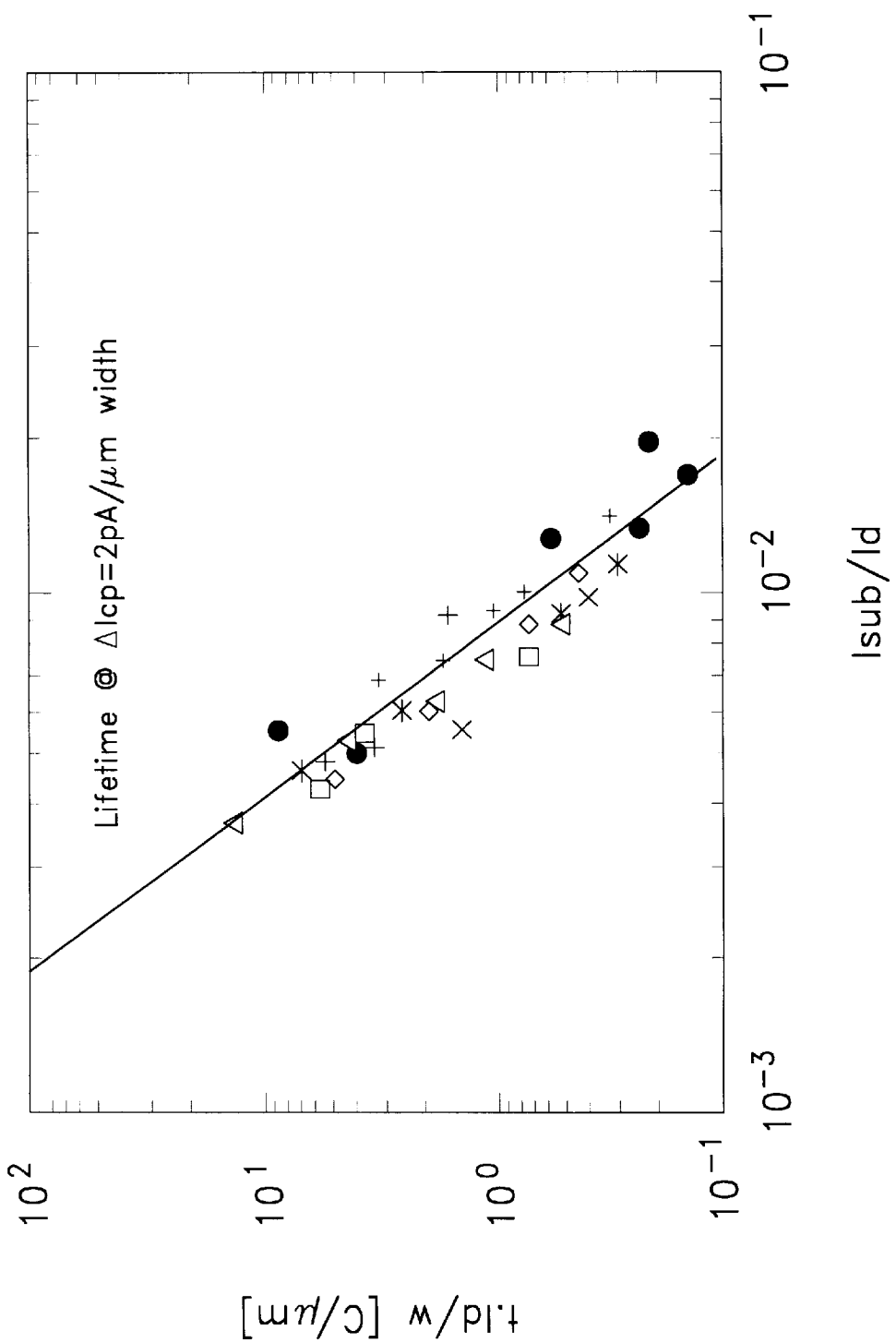
FIG. 12 is a lifetime curve with $\Delta I_{cp}$ as the degradation monitor for LDD and FOND with 6 different implant conditions. Identical hot-carrier degradation of the oxide is obtained in all devices.

To compare the physical damage built up in both device types, the lifetime as monitored with $\Delta I_{cp}$ is plotted versus the multiplication factor in FIG. 12, R. Bellens, P. Heremans, G. Groeseneken, H. E. Maes, "A New Procedure for Lifetime Prediction of n-Channel Transistors using the Charge Pumping Technique", Proc. IRPS, p. 8, 1988. It has been checked numerically that the conditions used for charge pumping measurements in this study fully assess the interface trap generation located under the polysilicon gate, above the $n^-$-region, P. Habas, R. Bellens, G. Groeseneken, "A Model Study of the Hot-Carrier Problem in LDD and Overlapped LDD MOSFET's", Proc. INFOS, p. 285, 1995. From the coincidence of the curves in FIG. 12, it follows that the same number of carriers are flowing through the channel ($\Delta I_{cp}$=2 pA/$\mu$m W), irrespective of the implant conditions. This indicates that the hot-carrier degradation of the gate oxide at a given silicon field is identical in both LDD and FOND devices and can therefore not be invoked to explain the results shown in FIG. 10. This indicates that the hot-carrier resistance of the gate oxide is not deteriorated by the high energy implantation of the $n^-$-regions through the polysilicon and gate oxide.

Figure 13:
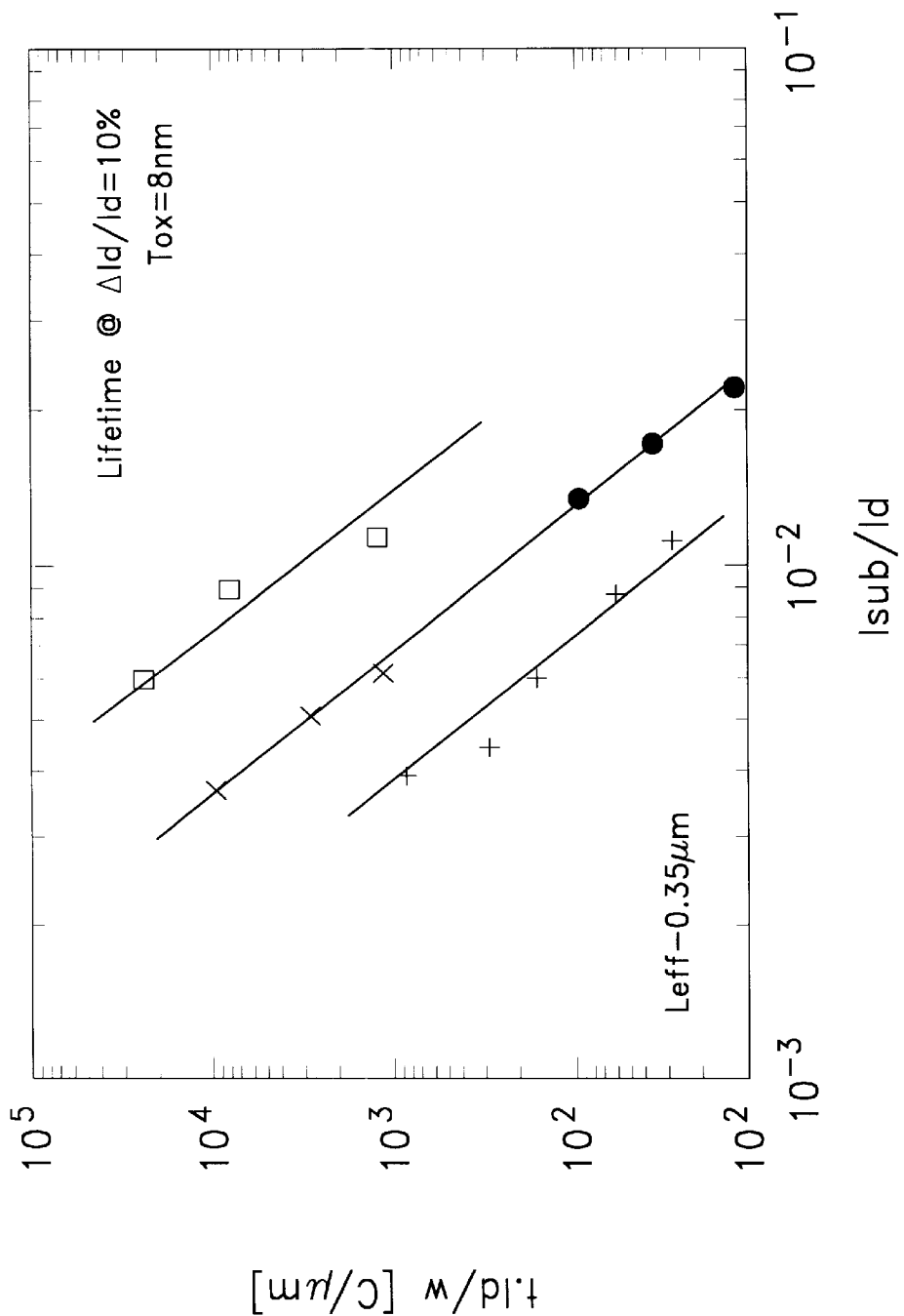
FIG. 13 is a lifetime curve with $\Delta I_d/I_d$ as the degradation monitor for LDD(•) and FOND (x: $1 \times 10^{14}$ cm⁻², 150 keV; +:$5 \times 10^{13}$ cm⁻², 160 keV; □:$8 \times 10^{13}$ cm⁻², 170 keV). The sensitivity of the FOND device to the generated damage can be varied significantly by changing the implant conditions.

The sensitivity of the device to a given damage is studied by plotting the lifetime curve based on the change of the I–V curves, characterized by $\Delta I_d/I_d$ or $\Delta g_m/g_m$. In contrast to the curve based on $\Delta I_{cp}$, a strong impact of the implant conditions is observed in FIG. 13. Assuming that for identical interface trap generation the oxide charge build-up is comparable, FIG. 13 shows that the sensitivity of a FOND device to the same physical damage can be varied by more than two orders of magnitude by changing the $n^-$-implant conditions. Note that this observation is consistent with the results in FIG. 6: a factor of 2 difference in the degradation has been found between the conditions with the highest and with the lowest surface concentration. Due to the low rate of change of the $\Delta I_d/I_d$ degradation as a function of time, a factor of 2 may result in 2 orders of magnitude difference in device lifetime, as found in the experiments.

FOND devices are able to attain lifetimes in excess of ten years when operating at higher voltages than conventional LDD devices. Table 4 below shows the operating voltages of conventional LDD devices having different gate lengths.

TABLE 4

Operating Voltages of Conventional LDD Devices

| Gate Length | Operating Voltage |
|---|---|
| 0.5 $\mu$m | 3.3 V |
| 0.35 $\mu$m | 3.3 V |
| 0.25 $\mu$m | 2.5 V |
| 0.18 $\mu$m | 1.8 V |

Figure 14:
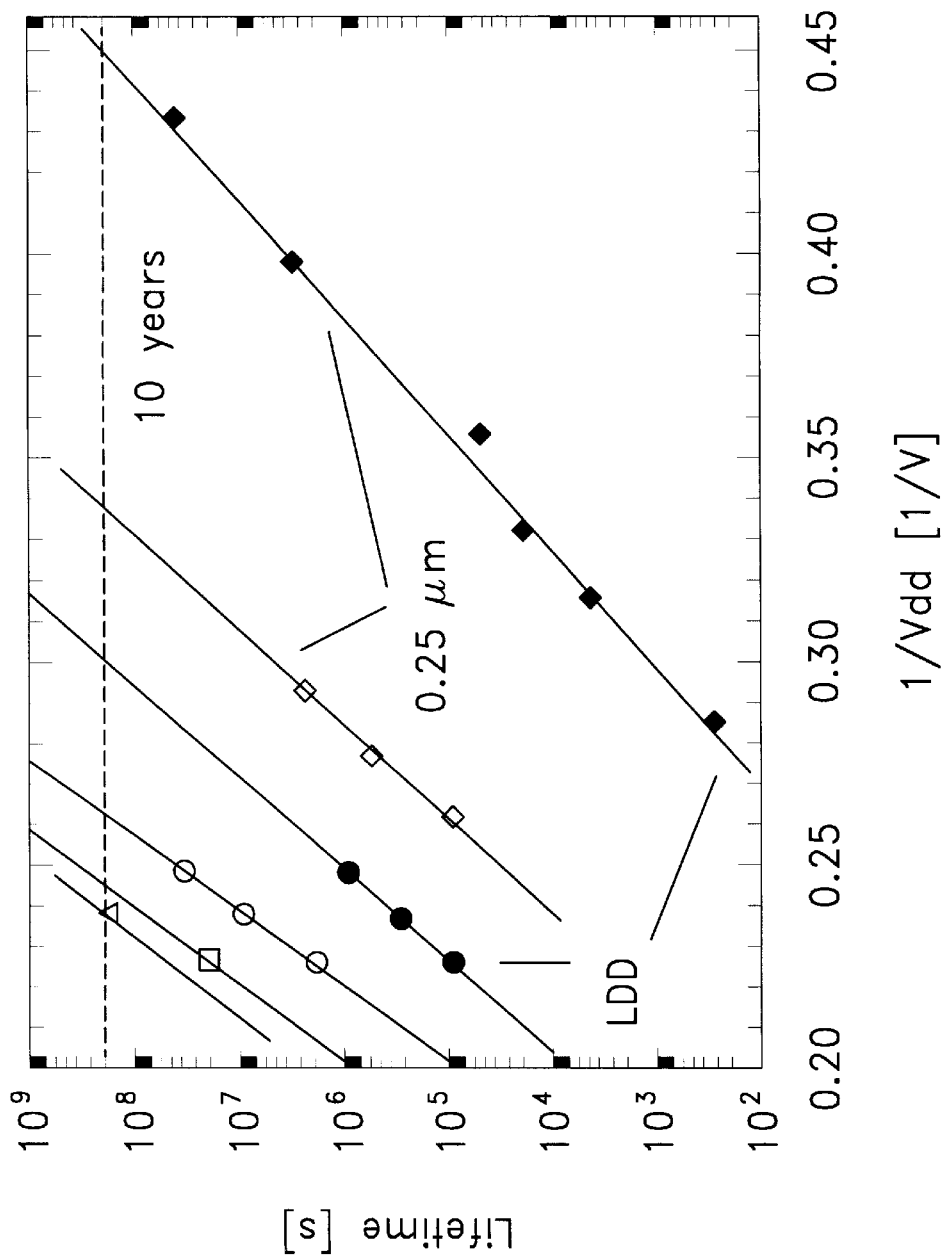
FIG. 14 plots the lifetime of FOND and LDD devices versus $1/V_{dd}$. Open symbols are for FOND, closed symbols for LDD. o is for 0.35 μm FOND1, □ for 0.35 μm FOND2 and Δ for 0.35 μm FOND3 and ◊ for the 0.25 μm FOND. The process conditions for these devices are summarized in Table 1.

FIG. 14 demonstrates that FOND devices having a given gate length are capable of achieving lifetimes in excess of ten years when operating at higher voltages than conventional LDD devices having the same gate length. In FIG. 14, the results of the lifetime extrapolation ($\tau$ versus $1/V_d$) for n-MOS 0.35 $\mu$m and 0.25 $\mu$m FOND devices with different implant conditions and for the reference LDD device are shown. $\Delta I_d/I_d$ is the lifetime determining parameter. The power supply voltage for a lifetime of ten years and the lifetime at 3.3 V are given in Table 5 for various devices. The lifetime of the 0.35-$\mu$m FOND devices exceeds that of the LDD devices by more than two orders of magnitude and greatly surpasses 10 years. These results were confirmed by measurements on wafers from various batches. Also included in FIG. 14 are the hot-carrier results for 0.25-$\mu$m FOND and LDD devices. They show that the hot-carrier lifetimes of 0.25-$\mu$m FOND devices for $V_{dd}$=3.3 V are of the same order of magnitude as the lifetime of 0.25-$\mu$m LDD devices for $V_{dd}$=2.5 V. Likewise, for the 0.35 $\mu$m FOND devices, lifetimes exceeding 10 years are obtained at higher operating voltages than for conventional LDD devices.

TABLE 5

Power supply voltage for 10 years lifetime and lifetime at 3.3 V supply voltage for different 0.35 $\mu$m devices. 10% $\Delta I_d/I_d$ is the lifetime criterion.

| | $V_{ddmax}$ @ 10 yrs | Lifetime @ 3.3 V |
|---|---|---|
| LDD | 2.9 V | 5.2 years |
| FOND 1 | 3.5 V | 660 years |
| FOND 2 | 4.0 V | >5000 years |
| FOND 3 | 4.1 V | >5000 years |

E. PERFORMANCE VS RELIABILITY TRADE-OFF

Figure 15:
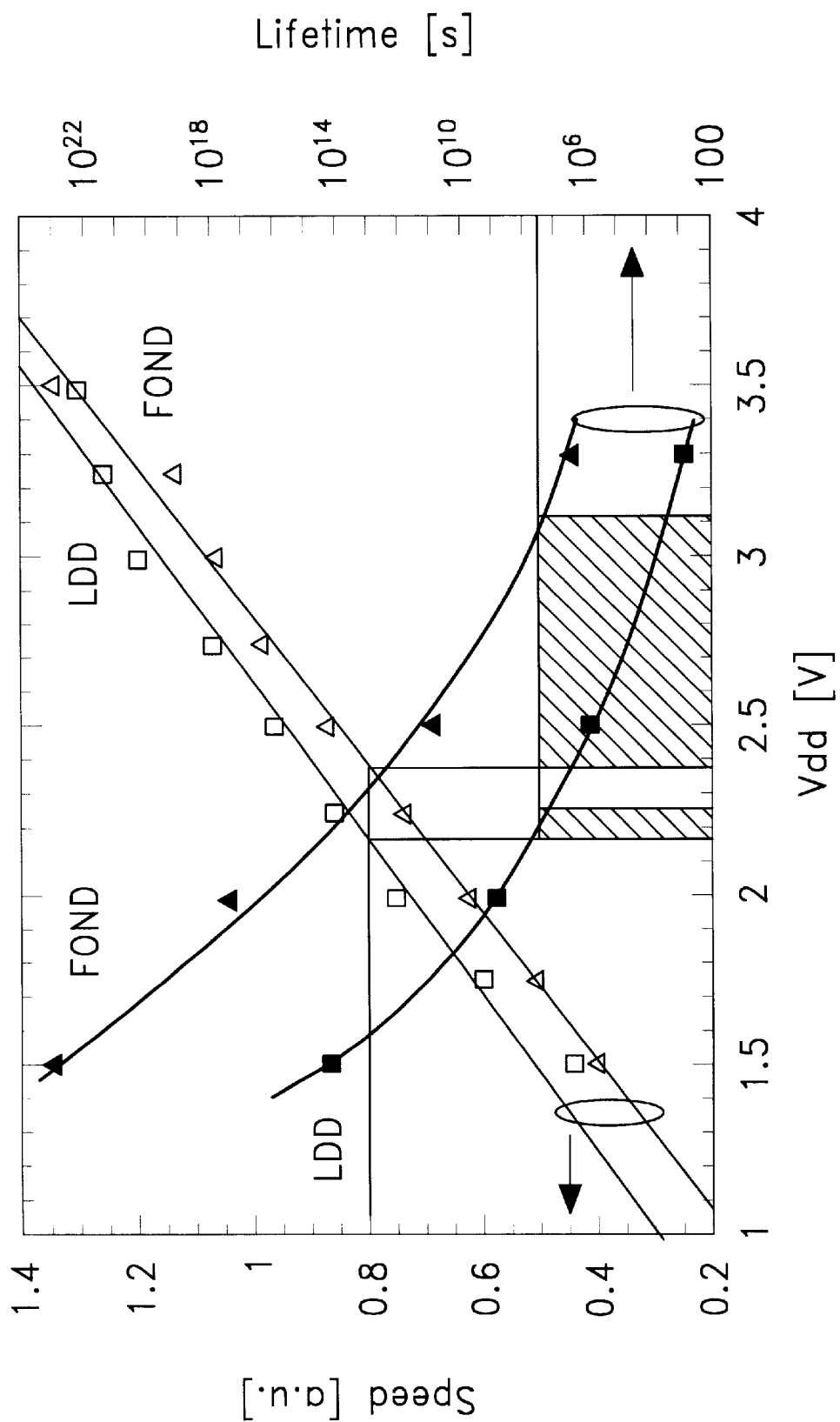
FIG. 15 depicts the trade-off of performance versus reliability.

To evaluate the trade-off between performance and reliability, FIG. 15 shows the normalized speed and the hot-carrier lifetime for both LDD and FOND devices of the 0.25-$\mu$m process as a function of the power supply voltage. By defining a speed (e.g. at 0.8 on the figure) and a lifetime ($3.10^7$ s) a window for allowed power supply voltages can be derived, as indicated by the shaded areas on FIG. 15. It is clear that for the chosen specifications the LDD device cannot be operated at 2.5 V and has a very narrow supply voltage window. On the contrary, the 0.25-$\mu$m FOND device has a much larger window and can even be operated at 3 V, leading to a much higher speed performance for comparable hot-carrier lifetimes compared to the LDD device at 2.5 V.

A new type of fully overlapped device architecture called FOND is disclosed above. Similar current driveability has been achieved for FOND and conventional LDD devices although in the FOND device significantly smaller $n^-$-concentrations are used. On the other hand, a larger polysilicon length and self-alignment of the junction implant to the polysilicon gives rise to a higher gate and overlap capacitance than in an LDD device. The adverse effect on actual circuit speed is limited, as shown by a 10% increase in delay time measured in 0.25-$\mu$m CMOS ring oscillators. The hot-carrier resistance of LDD and overlapped LDD devices has been analyzed and optimized by numerical simulation, and verified experimentally. A dramatic improvement in degradation performance of FOND devices has been achieved by a reduction of the carrier heating and the avalanche carrier generation due to the decrease of the lateral electric field, in combination with a lower sensitivity to hot-carrier damage. This is the result of the ability to use a low n⁻-concentration together with a well controlled gate-drain overlap. In this way, one of the limitations for optimizing LDD devices has been overcome in FOND devices. Based on experimental and numerical simulation results a model has been proposed that consistently explains the impact of the LDD implant conditions on the observed reliability performance.

While particular embodiments of the invention have been described in detail, it will be apparent to those skilled in the art that these embodiments are exemplary rather than limiting, and the true scope of the invention is that defined in the following claims.

What is claimed is:

1. A method of manufacturing a transistor, comprising the steps of:
    a) forming an insulating layer on a semiconductor substrate;
    b) depositing a polysilicon layer on said insulating layer;
    c) depositing a first etch mask layer on said polysilicon layer;
    d) patterning said first etch mask layer on said polysilicon layer by a sequence of at least one lithographic step and at least one etching step; and
    e) performing a first ion implant in said substrate using said patterned first etch mask layer thereby defining a source extension and a drain extension with a channel therebetween.

2. A method as recited in claim 1 further comprising the steps of:
    f) depositing a second etch mask layer on said polysilicon layer and on said first patterned etch mask layer;
    g) etching said second etch mask layer thereby forming spacers on said polysilicon layer adjacent to said first patterned etch mask layer;
    h) etching said polysilicon layer using said patterned first etch mask layer and said patterned second etch mask layer thereby forming a polysilicon gate;
    i) removing said first and said second etch mask layer; and
    j) thereafter performing a second ion implant in said substrate using said polysilicon gate as a mask thereby defining a source region which partially overlaps said source extension, and a drain region which partially overlaps said drain extension.

3. A method as recited in claim 2 further comprising:
    b.1) depositing an etch stop layer on said polysilicon layer and wherein step c comprises depositing a first etch mask layer on said etch stop layer.

4. A method as recited in claim 2 further comprising the steps of:
    c.1) depositing a thin silicon layer on said first etch mask layer;
    c.2) etching said silicon layer thereby forming a bilayer mask, comprising said silicon layer and said first etch mask layer, on said polysilicon layer; and
    c.3) removing said silicon layer.

5. A method as recited in claim 2 wherein the insulating layer formed is a silicon oxide.

6. A method as recited in claim 2 wherein said first etch mask layer and said second etch mask layer are a silicon nitride layer.

7. A method as recited in claim 2 wherein the implantation dose of said first implant is substantially lower than the implantation dose of said second implant.

8. A method as recited in claim 2 wherein the implantation dose of said first implant is in the range from $1 \times 10^{13}$ cm$^{-2}$ to $5 \times 10^{14}$ cm$^{-2}$.

9. A method as recited in claim 2 wherein said first implant is performed substantially perpendicular to the surface of the substrate whereby avoiding channeling of implanted dopants in said substrate.

10. A method as recited in claim 2 wherein said channel has a length in the range from 0.07 to 0.5 micrometer or smaller than 0.5 micrometer.

11. A method as recited in claim 2 further comprising:
    k) defining a dielectric spacer adjacent to said polysilicon gate.

12. A method as recited in claim 11 wherein said dielectric spacer is either one of a silicon nitride spacer or a silicon oxide spacer.

13. A method of manufacturing a transistor, comprising the steps of:
    a) forming an insulating layer on a semiconductor substrate;
    b) depositing a polysilicon layer on said insulating layer;
    c) depositing a first etch mask layer on said polysilicon layer;
    d) patterning said first etch mask layer on said polysilicon layer by a sequence of at least one lithographic step and at least one etching step; and
    e) performing a first ion implant in said substrate using said patterned first etch mask layer thereby defining a source extension and a drain extension with a channel therebetween.
    f) depositing a second etch mask layer on said polysilicon layer and on said first patterned etch mask layer;
    g) etching said second etch mask layer thereby forming spacers on said polysilicon layer adjacent to said first patterned etch mask layer;
    h) etching said polysilicon layer using said patterned first etch mask layer and said patterned second etch mask layer thereby forming a polysilicon gate;
    i) removing said first and said second etch mask layer;
    j) defining a dielectric spacer adjacent to said polysilicon gate; and
    k) thereafter performing a second ion implant in said substrate using said polysilicon gate as a mask thereby defining a source region which partially overlaps said source extension, and a drain region which partially overlaps said drain extension.

14. A method as recited in claim 13 wherein said dielectric spacer is either one of a silicon nitride spacer or a silicon oxide spacer.

* * * * *